(12) United States Patent
Hai et al.

(10) Patent No.: US 12,364,141 B2
(45) Date of Patent: Jul. 15, 2025

(54) TEXTURE RECOGNITION ASSEMBLY, MANUFACTURING METHOD THEREOF, AND DISPLAY DEVICE

(71) Applicant: BOE TECHNOLOGY GROUP CO., LTD., Beijing (CN)

(72) Inventors: Xiaoquan Hai, Beijing (CN); Sen Ma, Beijing (CN); Qiuyu Ling, Beijing (CN); Lei Wang, Beijing (CN); Yingzi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 793 days.

(21) Appl. No.: 17/621,061

(22) PCT Filed: Nov. 30, 2020

(86) PCT No.: PCT/CN2020/132644
§ 371 (c)(1),
(2) Date: Dec. 20, 2021

(87) PCT Pub. No.: WO2022/110105
PCT Pub. Date: Jun. 2, 2022

(65) Prior Publication Data
US 2023/0255088 A1    Aug. 10, 2023

(51) Int. Cl.
*H10K 59/65*    (2023.01)
*G06V 40/13*    (2022.01)
(Continued)

(52) U.S. Cl.
CPC ............. *H10K 59/65* (2023.02); *H10K 39/32* (2023.02); *H10K 59/875* (2023.02);
(Continued)

(58) Field of Classification Search
CPC ........ H10K 59/80; H10K 39/32; H10K 59/90; H10K 71/50; H10K 2102/311;
(Continued)

(56) References Cited

U.S. PATENT DOCUMENTS

2020/0234026 A1*   7/2020   Du .................... G06V 40/1312
2020/0293738 A1*   9/2020   Zhang ............... G06V 40/1318
(Continued)

FOREIGN PATENT DOCUMENTS

CN    107480661 A    12/2017
CN    108629244 A    10/2018
(Continued)

OTHER PUBLICATIONS

China Patent Office, First Office Action, Jan. 26, 2025, for corresponding CN application No. 202080003070.6.

*Primary Examiner* — Benjamin Tzu-Hung Liu
(74) *Attorney, Agent, or Firm* — HOUTTEMAN LAW LLC

(57) ABSTRACT

A texture recognition assembly (100) includes: a substrate (1); an optical sensing structure (2) on the substrate; and a light path structure (3) on a side of the optical sensing structure distal to the substrate and including an inclined light transmitting channel (Q) such that light incident on the light path structure can only pass through the light transmitting channel. The light path structure includes at least two light shielding layers (31, 31*a*, 31*b*, 31*c*) and a light transmitting layer (32, 32*a*, 32*b*) located between any adjacent two of the at least two light shielding layers, the light shielding layer (31*a*) closest to the optical sensing structure includes a first light transmitting hole (311*a*), the light shielding layer (31*b*) farthest away from the optical sensing structure includes a second light transmitting hole (322*b*), (Continued)

the first light transmitting hole and the second light transmitting hole define the light transmitting channel.

20 Claims, 21 Drawing Sheets

(51) Int. Cl.
   *H10K 39/32* (2023.01)
   *H10K 59/80* (2023.01)
   *H10K 59/90* (2023.01)
   *H10K 71/50* (2023.01)
   *H10K 102/00* (2023.01)
(52) U.S. Cl.
   CPC ......... *H10K 59/8792* (2023.02); *H10K 59/90* (2023.02); *H10K 71/50* (2023.02); *G06V 40/1318* (2022.01); *H10K 59/80* (2023.02); *H10K 2102/311* (2023.02)
(58) Field of Classification Search
   CPC .. H10K 59/65; H10K 59/875; H10K 59/8792; G06V 40/1318
   See application file for complete search history.

(56) References Cited

U.S. PATENT DOCUMENTS

2021/0167229 A1* 6/2021 Lee ................... H01L 31/105
2022/0320064 A1* 10/2022 Takahashi ........... H04M 1/0266

FOREIGN PATENT DOCUMENTS

| | | |
|---|---|---|
| CN | 109784303 A | 5/2019 |
| CN | 109863506 A | 6/2019 |
| CN | 110088768 A | 8/2019 |
| CN | 110221466 A | 9/2019 |
| CN | 110308583 A | 10/2019 |
| CN | 110309705 A | 10/2019 |
| CN | 110333620 A | 10/2019 |
| CN | 110473887 A | 11/2019 |
| CN | 209729912 U | 12/2019 |
| CN | 110690364 A | 1/2020 |
| CN | 111564506 A | 8/2020 |
| CN | 111965881 A | 11/2020 |
| WO | 2016064222 A1 | 4/2016 |

* cited by examiner

TEXTURE RECOGNITION ASSEMBLY, MANUFACTURING METHOD THEREOF, AND DISPLAY DEVICE

CROSS-REFERENCE TO RELATED APPLICATIONS

This is a National Phase Application filed under 35 U.S.C. 371 as a national stage of PCT/CN2020/132644 filed on Nov. 30, 2020, the content of which is incorporated herein by reference in its entirety.

TECHNICAL FIELD

The present disclosure relates to the field of display technology, and in particular, to a texture recognition assembly, a method for manufacturing a texture recognition assembly, and a display device.

BACKGROUND

In a process of recognizing (or identifying) a texture optically, the problem of interference by ambient light may occur. Especially, when the ambient light is strong, an intensity of the ambient light transmitted through a fingerprint may be much greater than an intensity of detected light reflected from the fingerprint, which may cause fingerprint information recognized by a sensor based on the received light to be inaccurate. As a result, accurate information on the texture of the fingerprint may not be acquired.

SUMMARY

Embodiments of the present disclosure provide a texture recognition assembly, a method for manufacturing a texture recognition assembly, and a display device.

In a first aspect, embodiments of the present disclosure provide a texture recognition assembly, which includes a texture recognition region and a peripheral region at a periphery of the texture recognition region, the peripheral region having therein a binding region, and the texture recognition assembly further including:
  a substrate;
  an optical sensing structure on the substrate and in the texture recognition region; and
  a light path structure, which is on a side of the optical sensing structure distal to the substrate, at least in the texture recognition region and does not cover the binding region, and includes a plurality of light transmitting channels such that light incident on the light path structure passes through the light path structure only via the light transmitting channels;
  wherein the light path structure includes at least two light shielding layers and a light transmitting layer located between any adjacent two of the at least two light shielding layers, the at least two light shielding layers and the light transmitting layer are stacked together, the light shielding layer closest to the optical sensing structure includes therein first light transmitting holes arranged in an array, the light shielding layer farthest away from the optical sensing structure includes therein second light transmitting holes in one-to-one correspondence with the first light transmitting holes, a first light transmitting hole and a corresponding second light transmitting hole define a light transmitting channel, and orthogonal projections of the first light transmitting hole and the corresponding second light transmitting hole on the substrate do not overlap each other.

In some embodiments, a connection line between a center of the first light transmitting hole and a center of the corresponding second light transmitting hole forms a central axis of the light transmitting channel, the central axis and a normal of a plane where the substrate is located form an inclination angle $\theta x$, and $\theta x$ is in a range of [40°, 72°].

In some embodiments, a collimation light receiving angle $\theta$ of the light path structure satisfies a relationship of $\theta = \arctan(X+d)/H - \arctan(X-d)/H$, where $X$ is a distance between an orthogonal projection of a center of the first light transmitting hole on the substrate and an orthogonal projection of a center of the corresponding second light transmitting hole on the substrate, $d$ is a diameter of each of the first light transmitting hole and the corresponding second light transmitting hole, and $H$ is a distance between the first light transmitting hole and the corresponding second light transmitting hole in a direction perpendicular to the substrate.

In some embodiments, $\theta$ is in range of (0°, 60°].

In some embodiments, each first light transmitting hole has a diameter equal to a diameter of each second light transmitting hole.

In some embodiments, the light path structure includes two light shielding layers.

In some embodiments, the light path structure includes three or more light shielding layers, and the at least two light shielding layers include a first light shielding layer closest to the optical sensing structure, a second light shielding layer farthest away from the optical sensing structure, and at least one third light shielding layer between the first light shielding layer and the second light shielding layer; and
  each third light shielding layer includes therein third light transmitting holes in one-to-one correspondence with the first light transmitting holes, and a center of a third light transmitting hole is in the light transmitting channel defined by the first light transmitting hole and the second light transmitting hole which correspond to the third light transmitting hole.

In some embodiments, a period of the first light transmitting holes in the first light shielding layer, a period of the second light transmitting holes in the second light shielding layer, and a period of the third light transmitting holes in each third light shielding layer are equal to each other; and
  a center of a first light transmitting hole, a center of the second light transmitting hole corresponding to the first light transmitting hole, and a center of the third light transmitting hole corresponding to the first light transmitting hole are on a same straight line.

In some embodiments, the diameter of each first light transmitting hole, the diameter of each second light transmitting hole, and a diameter of each third light transmitting hole are equal to each other.

In some embodiments, the at least one third light shielding layer of the light path structure is one third light shielding layer.

In some embodiments, the light transmitting layer between the third light shielding layer and the first light shielding layer is a first light transmitting layer, the light transmitting layer between the third light shielding layer and the second light shielding layer is a second light transmitting layer, and a thickness of the first light transmitting layer is greater than a thickness of the second light transmitting layer.

In some embodiments, the light transmitting layer between the third light shielding layer and the first light shielding layer is a first light transmitting layer, and the light transmitting layer between the third light shielding layer and the second light shielding layer is a second light transmitting layer; and
the diameter of each first light transmitting hole is in a range of 2 um to 10 um, the period of first light transmitting holes is in a range of 10 um to 100 um, a thickness of the first light transmitting layer is in a range of um to 20 um, and a thickness of the second light transmitting layer is in a range of 5 um to 15 um.

In some embodiments, the at least one third light shielding layer of the light path structure is two or three third light shielding layers.

In some embodiments, the texture recognition region includes a photosensitive region, a spacer region, and a light shielding region, the spacer region is between the photosensitive region and the light shielding region;
the optical sensing structure is in the photosensitive region and the light shielding region, and has no pattern in the spacer region; and
an orthogonal projection of at least one of the at least two light shielding layers on the substrate completely covers the light shielding region.

In some embodiments, the light shielding region is on one side or two opposite sides or two intersecting sides of the photosensitive region.

In some embodiments, the light transmitting layer includes a transparent resin layer and a transparent inorganic insulating layer; and
between any adjacent two light shielding layers, the transparent resin layer is adjacent to the light shielding layer proximal to the substrate, and the transparent inorganic insulating layer is adjacent to the light shielding layer distal to the substrate.

In some embodiments, the light shielding layers extend from the texture recognition region to a joint edge of the peripheral region;
an orthogonal projection of the transparent resin layer on the substrate completely covers an orthogonal projection of an adjacent light shielding layer on the substrate; and
an orthogonal projection of the transparent inorganic insulating layer on the substrate completely covers and is larger than an orthogonal projection of an adjacent transparent resin layer on the substrate.

In some embodiments, the light path structure further includes a blocking wall structure, which surrounds the transparent resin layer, in a layer where the light shielding layer adjacent to the transparent resin layer is located, and is separate from the light shielding layer adjacent to the transparent resin layer.

In some embodiments, the optical sensing structure includes a plurality of optical sensors arranged in an array, one of the plurality of optical sensors corresponds to a plurality of first light transmitting holes, and one of the first light transmitting holes corresponds to one of the plurality of optical sensors.

In some embodiments, an orthogonal projection of each optical sensor on the substrate is a square of which each side has a length D, the period of the first light transmitting holes is P, and D and P satisfy the relationship of $D=N*P$, N being a positive even number.

In some embodiments, D is in a range of 10 um to 200 um.

In some embodiments, the optical sensing structure includes a gate electrode, a gate insulating layer, an active layer, a source-drain electrode, a first insulating layer, a first electrode, a semiconductor layer, a second electrode, a protective layer, a second insulating layer, a passivation layer, a bias voltage line, and a blocking layer, which are sequentially stacked along a direction away from the substrate.

In some embodiments, an orthogonal projection of the source-drain electrode on the substrate completely covers and is larger than an orthogonal projection of the first electrode on the substrate.

In some embodiments, the source-drain electrode is in direct contact with the semiconductor layer, and the source-drain electrode and the first electrode are in a same layer.

In some embodiments, the texture recognition assembly further includes a planarization layer, which is between the light path structure and the optical sensing structure, has a continuous surface, and has a hollow pattern only in the binding region.

In some embodiments, the texture recognition assembly further includes a ground shielding layer between the planarization layer and the optical sensing structure; and
the ground shielding layer is adjacent to the planarization layer, a pattern of the ground shielding layer is covered by a pattern of the planarization layer, and an orthogonal projection of the ground shielding layer on the substrate covers the optical sensing structure.

In some embodiments, the texture recognition assembly further includes a binding electrode in the binding region, and the binding electrode and the bias voltage line are in a same layer.

In some embodiments, the binding region includes a binding region of a gate driver chip, and a binding electrode in the binding region of the gate driver chip includes a first binding electrode;
a first connection electrode in a layer where the gate electrode is located, a second connection electrode in a layer where the source-drain electrode is located, and a third connection electrode in a layer where the first electrode is located are arranged between the first binding electrode and the substrate; and
the first connection electrode is electrically connected to the second connection electrode through a first through hole penetrating through the gate insulating layer, the second connection electrode is electrically connected to the third connection electrode through a second through hole penetrating through the first insulating layer, the third connection electrode is electrically connected to the first binding electrode through a third through hole penetrating through the passivation layer, and the first connection electrode is electrically connected to the gate electrode through a gate line and a gate line fan-out trace.

In some embodiments, each of a number of first through holes corresponding to one first binding electrode, a number of second through holes corresponding to the one first binding electrode, and a number of third through holes corresponding to the one first binding electrode is at least two, and orthogonal projections of the first through holes, the second through holes and the third through holes on the substrate do not overlap each other and are alternately arranged along an extension direction of the first binding electrode.

In some embodiments, the binding region further includes a binding region of a data driver chip, and binding electrodes in the binding region of the data driver chip include a second binding electrode and a third binding electrode;
a fourth connection electrode in a layer where the source-drain electrode is located and a fifth connection electrode in a layer where the first electrode is located are arranged between the second binding electrode and the substrate, the fourth connection electrode is electrically connected to the fifth connection electrode through a fourth through hole penetrating through the first insulating layer, the fifth connection electrode is electrically connected to the second binding electrode through a fifth through hole penetrating through the passivation layer, and the fourth connection electrode is electrically connected to the source-drain electrode through a data line and a data line fan-out trace; and the third binding electrode is electrically connected to the bias voltage line through a bias voltage fan-out trace.

In some embodiments, the texture recognition assembly further includes a light filter layer which is on a side of the semiconductor layer distal to the substrate, and is configured to cause a central wavelength of the light passing through the light filter layer to be less than 600 nm.

In some embodiments, the light filter layer is configured to transmit light having a wavelength ranging from 480 nm to 580 nm.

In some embodiments, a material of the second insulating layer includes a resin material having a light filtering function, and the light filter layer and the second insulating layer are multiplexed and combined into a same layer; and/or a material of the blocking layer includes a resin material having a light filtering function, and the light filter layer and the blocking layer are multiplexed and combined into a same layer; and/or each light transmitting layer includes a transparent resin layer and a transparent inorganic insulating layer, between any adjacent two light shielding layers, the transparent resin layer is adjacent to the light shielding layer proximal to the substrate, the transparent inorganic insulating layer is adjacent to the light shielding layer distal to the substrate, a material of the transparent resin layer includes a resin material having a light filtering function, and the light filter layer and the transparent resin layer are multiplexed and combined into a same layer.

In a second aspect, the embodiments of the present disclosure further provide a display device, which includes the texture recognition assembly according to any one of the foregoing embodiments of the first aspect, and a display panel on the texture recognition assembly, wherein the display panel and the texture recognition assembly are fixed together by an optically clear adhesive.

In some embodiments, the display panel is an OLED display panel, the OLED display panel includes an OLED display back plate, a polarizer, and a protective cover plate, which are sequentially stacked in a direction away from the texture recognition assembly, and the protective cover plate includes a material of polyimide.

In some embodiments, the OLED display panel has a thickness ranging from 0.2 mm to 1.5 mm.

In some embodiments, the OLED display panel has a thickness ranging from 0.4 mm to 0.65 mm.

In some embodiments, the display device further includes a middle frame, the middle frame includes a bottom plate and a sidewall formed by an edge of the bottom plate bending towards a front surface of the bottom plate, the bottom plate and the sidewall form a holding groove, the texture recognition assembly and the display panel are fixed in the holding groove, and the display panel is on a side of the texture recognition assembly distal to the bottom plate.

In some embodiments, the texture recognition assembly is fixed to the bottom plate; and/or the sidewall includes a step-shaped support structure to which the display panel is fixed.

In some embodiments, a through hole is formed in the bottom plate, and the display device further includes a texture-recognition flexible circuit board and a texture-recognition chip; and the texture-recognition flexible circuit board penetrates through the through hole, one end of the texture-recognition flexible circuit board is electrically connected to the binding electrode in the binding region of the texture recognition assembly, and the other end of the texture-recognition flexible circuit board is electrically connected to the texture-recognition chip positioned on a back surface of the bottom plate.

In a third aspect, the embodiments of the present disclosure further provide a method for manufacturing the texture recognition assembly according to any one of the foregoing embodiments of the first aspect, wherein the texture recognition assembly includes the texture recognition region and the peripheral region at the periphery of the texture recognition region, the peripheral region having therein the binding region, and the method includes:

providing the substrate;

forming the optical sensing structure on the substrate and in the texture recognition region; and forming the light path structure on the optical sensing structure, wherein the light path structure is at least in the texture recognition region and does not cover the binding region, and is provided with the plurality of light transmitting channels such that light incident on the light path structure passes through the light path structure only via the light transmitting channels; the light path structure includes the at least two light shielding layers and the light transmitting layer located between any adjacent two of the at least two light shielding layers, the at least two light shielding layers and the light transmitting layer are stacked together, the light shielding layer closest to the optical sensing structure is provided therein with the first light transmitting holes arranged in an array, the light shielding layer farthest away from the optical sensing structure is provided therein with the second light transmitting holes in one-to-one correspondence with the first light transmitting holes, a first light transmitting hole and a corresponding second light transmitting hole define a light transmitting channel, and the orthogonal projections of the first light transmitting hole and the corresponding second light transmitting hole on the substrate do not overlap each other.

In some embodiments, forming a light shielding layer during forming the light path structure includes:

forming a light shielding material film; and processing the light shielding material film through a photolithography process or a nano-imprinting process to form light transmitting holes in the light shielding material film.

In some embodiments, forming the light transmitting layer during forming the light path structure includes:

forming a transparent resin layer on a light shielding layer by using an ink-jet printing process; and forming a transparent inorganic insulating layer on the transparent resin layer by using a low temperature chemical vapor deposition process, wherein the transparent inorganic insulating layer covers the transparent resin layer.

DETAILED DESCRIPTION

Figure 1A:
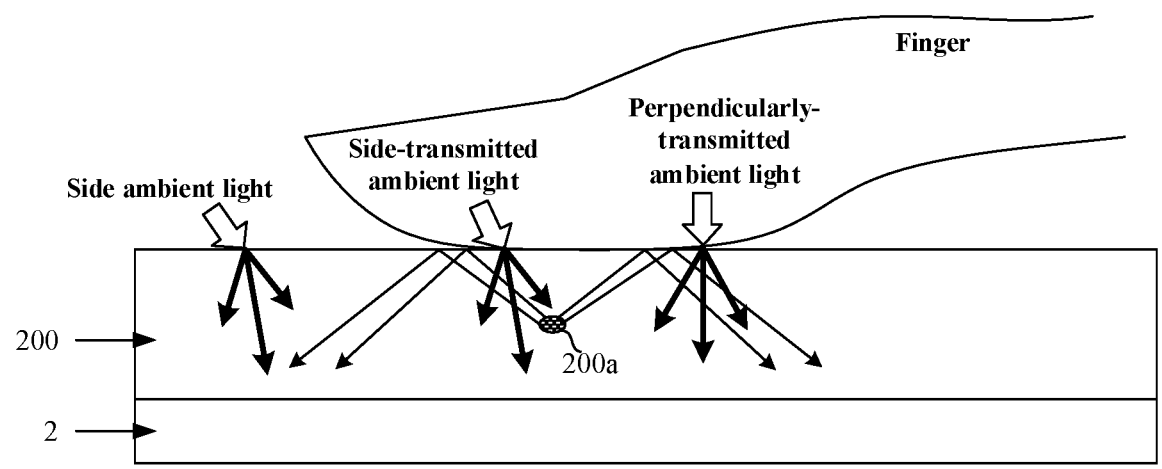
FIG. 1a is a schematic diagram showing that external ambient light enters into a display panel and light emitted from the display panel is reflected by a surface of a fingerprint.

To enable one of ordinary skill in the art to better understand technical solutions of the present disclosure, a texture recognition assembly, a method for manufacturing a texture recognition assembly, and a display device provided by the present disclosure will be described in detail below with reference to the accompanying drawings.

Example embodiments will be described more fully hereinafter with reference to the accompanying drawings, but may be embodied in different forms and should not be construed as limited to the forms set forth herein. Rather, these embodiments are provided so that the present disclosure will be thorough and complete, and will fully convey the scope of the present disclosure to one of ordinary skill in the art. The shapes and sizes of various elements shown in the drawings are not necessarily drawn to scale and are merely schematic representations of the present disclosure.

The terms used herein are for the purpose of describing particular embodiments only and are not intended to limit the present disclosure. As used herein, the singular forms "a", "an" and "the" are intended to include a plural form as well, unless the context clearly indicates otherwise. It should be further understood that, the terms of "including" and/or "comprising," when used in this specification, specify the presence of stated features, integers, steps, operations, elements, and/or components, but do not preclude the presence or addition of one or more other features, integers, steps, operations, elements, components, and/or groups thereof. Embodiments of the present disclosure and features of the embodiments may be combined with each other in case of no conflict.

Unless otherwise defined, all terms (including technical and scientific terms) used herein have the same meaning as commonly understood by one of ordinary skill in the art. It should be further understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

Referring to FIG. 1a, a display device with a texture recognition function generally includes a display panel 200 and an optical sensing structure 2. When a texture is to be recognized, a fingerprint contacts a surface of the display panel 200, and detection light emitted from a light emitting device 200a in the display panel 200 is reflected by a surface of the fingerprint and then incident on the optical sensing structure. Further, each optical sensor in the optical sensing structure recognizes a ridge or a valley of the fingerprint at a corresponding position based on the received light (i.e., the detection light reflected by the surface of the fingerprint).

In the detection light incident on the optical sensing structure, the greater an incident angle is, the smaller a light intensity is. The incident angle is an angle formed by a light ray and a normal of a plane where the display panel is located (i.e., the normal is perpendicular to the plane where the display panel is located).

In the related art, in consideration of the factors that the detection light perpendicularly incident to the optical sensing structure has a maximum intensity and the intensity of the detection light decreases as the incident angle thereof increases, a light path structure is generally disposed between the optical sensing structure and the display panel, and is provided with a plurality of light transmitting channels, such that the light incident on the light path structure can only pass through the light transmitting channels. An extension direction of each of the light transmitting channels is perpendicular to the plane where the display panel is located, so that the incident angle of a light ray which passes through a light transmitting channel and incident on the optical sensing structure is a small angle ranging from 0° to 10°, and each optical sensor can receive strong detection light. However, it is found in practical applications that, when the ambient light is strong, the strong ambient light will enter into the display panel and passes through the light transmitting channels in the light path structure to be incident on the optical sensing structure, so as to interfere with the fingerprint detection.

Referring to FIG. 1a, there are three ways for the ambient light to enter into the display panel: 1) a portion of the ambient light is refracted into the display panel directly through a surface of the display panel without passing through the finger, and this portion of the ambient light is referred to as "side ambient light"; 2) a portion of the ambient light passes through the finger and is incident on a surface of the display panel at a large incident angle and eventually enters into the display panel, and this portion of the ambient light is referred to as "side-transmitted ambient light"; and (3) a portion of the ambient light passes through the finger and is incident on a surface of the display panel at a small incident angle (e.g., this portion of the ambient light is perpendicular or substantially perpendicular to the surface of the display panel) and eventually enters into the display panel, and this portion of the ambient light is referred to as "perpendicularly-transmitted ambient light". Researches show that an incident angle of the side ambient light, the side-transmitted ambient light or the perpendicularly-transmitted ambient light after entering into the display panel is always between 0° and 50°, and an incident angle of the detection light for detecting a texture ranges from 0° to 72°.

Figure 1B:
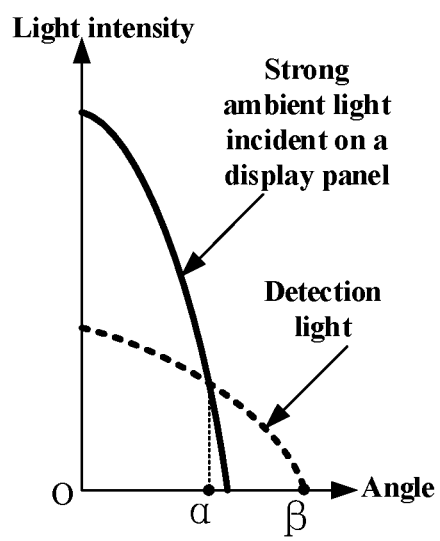
FIG. 1b is a schematic diagram showing an angle-intensity curve of strong ambient light incident on a display panel and an angle-intensity curve of detected light reflected by a fingerprint.

As shown in FIG. 1b, it is found through researches that, the ambient light entering the display panel also conforms to the rule that the larger an incident angle thereof is, the smaller an intensity thereof is, and in a small angle range of 0° to 10°, the intensity of the ambient light is always greater than that of the detection light. Therefore, in the prior art, although the manner in which an incident angle of the light incident on the optical sensing structure is limited to a small angle by the light path structure can result in strong received detection light, stronger ambient light is received at the same time. Thus, the stronger ambient light will have great interference on a result of recognizing a texture, and seriously decrease an accuracy of the result of recognizing the texture.

To solve the technical problems that the result of recognizing a texture is not accurate under the ambient light in the related art, embodiments of the present disclosure provide a texture recognition assembly for recognizing and detecting biological characteristics such as a fingerprint, a palmprint, and/or the like. Referring to FIGS. 2a to 2d, the texture recognition assembly includes a texture recognition region A and a peripheral region B that is located at a periphery of the texture recognition region A, and the peripheral region B includes a binding region C. For example, the texture recognition assembly includes the following:

a substrate 1, a material of which may be PI (i.e., polyimide) or glass;

an optical sensing structure 2 located on the substrate 1 and in the texture recognition region A; and a light path structure 3, which is located on a side of the optical sensing structure 2 distal to the substrate 1, at least in the texture recognition region A and does not cover the binding region C. The light path structure 3 is provided with a plurality of light transmitting channels Q, and light incident on the light path structure 3 can only pass through the light transmitting channels Q.

The light path structure 3 includes at least two light shielding layers and a light transmitting layer 32 located between any adjacent two of the at least two light shielding layers, and the at least two light shielding layers and the light transmitting layer 32 are stacked together. Among the at least two light shielding layers, the light shielding layer closest to the optical sensing structure 2 is a first light shielding layer 31a, and the light shielding layer farthest away from the optical sensing structure 2 is a second light shielding layer 31b. The first light shielding layer is provided with therein a plurality of first light transmitting holes 311a arranged in an array, and the second light shielding layer 31b is provided with therein a plurality of second light transmitting holes 311b being in one-to-one correspondence with the plurality of first light transmitting holes 311a. Each first light transmitting hole 311a and a corresponding second light transmitting hole 311b (i.e., a second light transmitting hole 311b corresponding to the first light transmitting hole 311a) define a light transmitting channel Q. Further, an orthogonal projection of each first light transmitting hole 311a on the substrate 1 does not overlap an orthogonal projection of the corresponding second light transmitting hole 311b on the substrate 1.

In an embodiment of the present disclosure, each first light transmitting hole 311a and a corresponding second light transmitting hole 311b (i.e., a second light transmitting hole 311b corresponding to the first light transmitting hole 311a) define a light transmitting channel Q, which specifically means that, a channel formed by one first light transmitting hole and a second light transmitting hole corresponding to the one first light transmitting hole, for allowing light to pass therethrough. A connection line between a center of the one first light transmitting hole 311a and a center of the second light transmitting hole 311b corresponding to the one first light transmitting hole forms a central axis CL of the defined light transmitting channel Q, and the central axis CL is a virtual line but not a real structure. In the present disclosure, each second light transmitting hole 311b serves as a light inlet of a corresponding light transmitting channel Q, and the corresponding first light transmitting hole 311a serves as a light outlet of the corresponding light transmitting channel Q.

Each light transmitting channel Q can collimate light rays incident at various angles on the corresponding second light transmitting hole 311b, so that the light rays emitted from the corresponding first light transmitting hole 311a are within a preset small exit angle range, and a difference between a maximum angle and a minimum angle in the preset small exit angle range is referred to as a light receiving angle θ of the light transmitting channel.

In an embodiment of the present disclosure, by adjusting an inclination angle θx formed by the central axis CL of each light transmitting channel Q and the normal of the plane where the substrate 1 is located, a distance H between the first light shielding layer 31a and the second light shielding layer 31b, and a diameter d of each of the first light transmitting hole 311a and the second light transmitting hole 311b, a depth-to-width ratio of each light transmitting channel Q is adjusted, so that the light receiving angle θ of the light path structure is limited, and the required collimation effect is achieved, thereby acquiring information of the valleys and the ridges of a texture accurately. Further, the first light transmitting holes 311a in the first light shielding layer 31a and the second light transmitting holes 311b in the second light shielding layer 31b are generally designed to have a same diameter to ensure the required light receiving angle θ.

In the present disclosure, since the orthogonal projections of each first light transmitting hole 311a and the corresponding second light transmitting hole 311b on the substrate 1 do not overlap each other, the central axis CL of the light transmitting channel Q defined by the first light transmitting hole 311a and the corresponding second light transmitting hole 311b is not perpendicular to the substrate 1 (i.e., an angle between the central axis of the light transmitting channel Q and the normal of the plane where the substrate 1 is located is greater than 0°), and light with an incident angle of 0° and close to 0° cannot pass through the light transmitting channel Q.

When a texture is recognized under strong ambient light, as shown in FIG. 1b, since the high-brightness ambient light with an incident angle of 0° and close to 0° in the display panel cannot pass through the light path structure 3, the ambient light reaching the optical sensing structure 2 has a significantly reduced intensity, which is beneficial to improving the accuracy of recognizing a texture.

It should be noted that, although the light path structure 3 may also block the detection light with the incident angle of 0° and close to 0° from passing therethrough, to decrease an intensity of the detection light received by the optical sensing structure 2, a decrease percentage of the intensity of the ambient light is greater than a decrease percentage of the intensity of the detection light. Thus, a proportion of the detection light in the light received by the optical sensing structure 2 can be increased, which is beneficial to improving the accuracy of recognizing a texture.

Figure 1C:
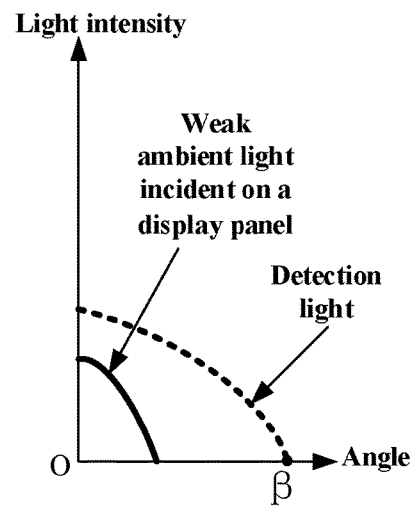
FIG. 1c is a schematic diagram showing an angle-intensity curve of weak ambient light incident on a display panel and an angle-intensity curve of detected light reflected by a fingerprint.

When a texture is recognized under weak ambient light, as shown in FIG. 1c, although the arrangement of the light path structure 3 may cause the overall decrease amount of the intensity of the detection light to be greater than the overall decrease amount of the intensity of the ambient light, since the intensity of the detection light is always greater than the intensity of the ambient light at various angles. Thus, the proportion of the detection light in the light received by the optical sensing structure 2 is always kept at a larger value, and the result of recognizing a texture still has a high accuracy.

In FIG. 1b, an abscissa of an intersection point of an angle-intensity curve corresponding to the strong ambient light passing through a fingerprint and an angle-intensity curve of the detection light reflected by the fingerprint is α, and an abscissa of an intersection point of the angle-intensity curve of the detection light reflected by the fingerprint and the horizontal axis is β. When each light transmitting channel Q of the light path structure 3 is designed, the inclination angle θx formed by the central axis CL of the light transmitting channel Q and the normal of the plane where the substrate 1 is located should range from α to β as much as possible, so that the interference of the ambient light can be mitigated, and the accurate fingerprint recognition can be realized.

Data acquisition and analysis in advance show that a generally ranges about 40° to about 50°, and the maximum angle of the detection light reflected by a fingerprint is about 72°. Based on the result of the data acquisition and analysis, in an embodiment of the present disclosure, the inclination angle θx formed by the central axis CL of each light transmitting channel Q and the normal of the plane where the substrate 1 is located is within a range of [40°, 72°].

In addition, signals emitted from each light emitting element (which is generally an organic light emitting diode (OLED) device) in the display panel follow the Lambertian distribution in which a larger angle results in a smaller intensity of light, and θx should be as close to a as possible to ensure that the signal received by an optical sensor in the optical sensing structure 2 has a high intensity. Apparently, θx can be adjusted appropriately according to requirements of different applications. In some embodiments, the inclination angle θx and the collimation light receiving angle θ of each light transmitting channel Q in the light path structure 3 satisfy the following relationship:

$$\theta x = \arctan(X/H)$$

$$\theta = \arctan(X+d)/H - \arctan(X-d)/H$$

Where, X is a distance between an orthogonal projection of a center of a first light transmitting hole 311a on the substrate 1 and an orthogonal projection of a center of the second light transmitting hole 311b corresponding to the first light transmitting hole 311a on the substrate 1, d is the diameter of each of the first light transmitting hole 311a and the second light transmitting hole 311b, and H is a distance between the first light transmitting hole 311a and the second light transmitting hole 311b in a direction perpendicular to the substrate 1. In some embodiments, θ is within a range of (0°, 60°].

Figure 2A:
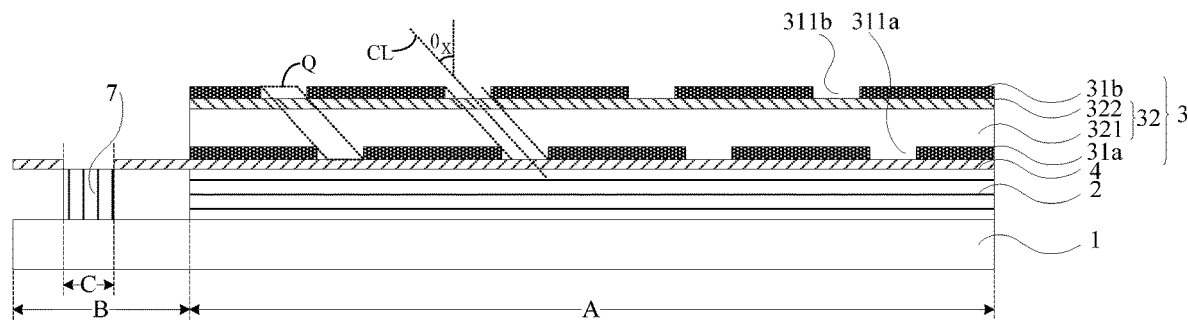
FIG. 2a is a schematic diagram showing a structure of a texture recognition assembly according to an embodiment of the present disclosure.

Referring to FIG. 2a, in some embodiments, the at least two light shielding layers in the light path structure 3 includes two light shielding layers, which are the first light shielding layer 31a and the second light shielding layer 31b.

Figure 2B:
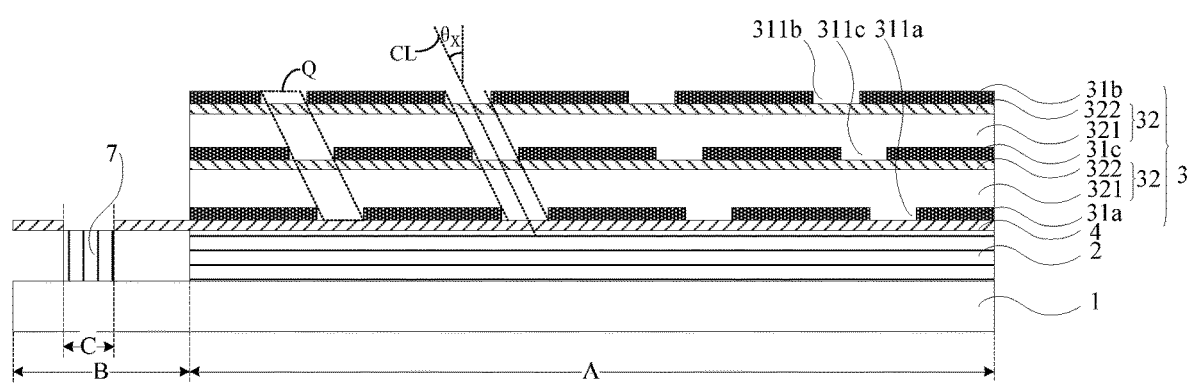
FIG. 2b is a schematic diagram showing another structure of a texture recognition assembly according to an embodiment of the present disclosure.
Figure 2C:
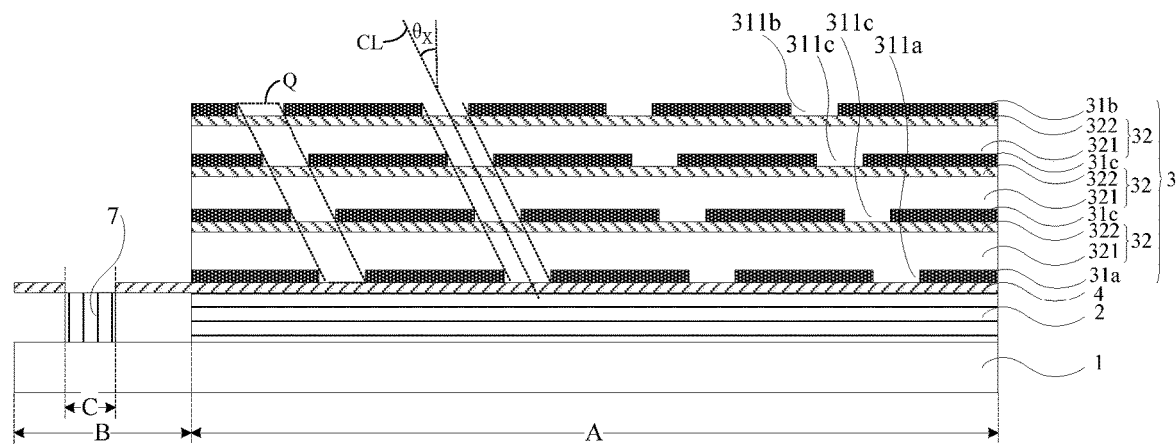
FIG. 2c is a schematic diagram showing still another structure of a texture recognition assembly according to an embodiment of the present disclosure.

Referring to FIG. 2b and FIG. 2c, in some embodiments, the number of the at least two light shielding layers in the light path structure 3 is greater than 2, i.e., the light shielding layers in the light path structure 3 include not only the first light shielding layer 31a and the second light shielding layer 31b, but also at least one third light shielding layer 31c located between the first light shielding layer 31a and the second light shielding layer 31b. The third light shielding layer 31c are provided therein with a plurality of third light transmitting holes 311c in one-to-one correspondence with the plurality of first light transmitting holes 311a, and a center of a third light transmitting hole 311c is located in the light transmitting channel Q defined by the first light transmitting hole 311a and the second light transmitting hole 311b which correspond to the third light transmitting hole 311c.

In the light path structure 3 having two light shielding layers as shown in FIG. 2a, when an incident angle of the light incident on the light path structure 3 is large and a period P of the first light transmitting holes 311a in the first light shielding layer 31a and/or the second light transmitting holes 311b in the second light shielding layer 31b is small, there may be a problem that a portion of the light passing through a second light transmitting hole 311b is emitted to a first light transmitting hole 311a not corresponding to the second light transmitting hole 311b (e.g., another first light transmitting hole 311a adjacent to the first light transmitting hole 311a corresponding to the second light transmitting hole 311b), thereby causing light crosstalk. Under the condition that the diameter of each of a first light transmitting hole 311a and the corresponding second light transmitting hole 311b and the collimation light receiving angle θ of the light path structure 3 are given, in order to avoid the problem of light crosstalk, the period P of the first light transmitting holes 311a in the first light shielding layer 31a and/or the second light transmitting holes 311b in the second light shielding layer 31b should generally be increased. However, the increase of the period P may cause the number of the first light transmitting holes 311a and the second light transmitting holes 311b to be decreased, the number of the light transmitting channels Q to be decreased either, and an intensity of light received by the optical sensing structure 2 to be decreased, which is not favorable for recognizing a texture. It should be noted that the "period" of the holes herein refers to a distance between the centers of any adjacent two of the holes in a same layer.

In an embodiment of the present disclosure, the at least one third light shielding layer 31c is disposed between the first light shielding layer 31a and the second light shielding layer 31b, and is configured to block the light that passes through a second light transmitting hole 311b and irradiates to the other light transmitting holes except the first light transmitting hole 311a corresponding to the second light transmitting hole 311b, without affecting the light transmission amount of the light transmitting channel Q defined by the corresponding first light transmitting hole 311a and the second light transmitting hole 311b, thereby effectively avoiding the problem of light crosstalk and improving the accuracy of the recognized information of a texture. Meanwhile, by arranging the at least one third light shielding layer 31c for avoiding the problem of light crosstalk, the period P of the first light transmitting holes 311a in the first light shielding layer 31a and/or the second light transmitting holes 311b in the second light shielding layer 31b is reduced accordingly. As a result, the number of the first light transmitting holes 311a in the first light shielding layer 31 and/or the second light transmitting holes 311b in the second light shielding layer 31b is increased accordingly, the number of the light transmitting channels Q is also increased, and the intensity of light received by the optical sensing structure 2 is increased, which is beneficial to recognizing a texture.

In order to prevent a third light shielding layer 31c from affecting the light transmission amount of the light transmitting channel defined by a first light transmitting hole 311a and the corresponding second light transmitting hole 311b, a diameter of a third light transmitting hole 311c in the third light shielding layer 31c is generally greater than or equal to the diameter of the first light transmitting hole 311a corresponding to the third light transmitting hole 311c. However, if the diameter of each third light transmitting hole 311c is large, the light shielding range of the third light shielding layer 31c is small, and in this case the risk of occurring light crosstalk is great. In a practical application, the diameter of each third light transmitting hole 311c may be 20% to 50% greater than the diameter of the corresponding first light transmitting hole 311a and/or the corresponding second light transmitting hole 31b, and may be designed and adjusted according to requirements of different scenarios.

In some embodiments, each first light transmitting hole 311a, each second light transmitting hole 311b, and each third light transmitting hole 311c have a same diameter.

In some embodiments, the period of the first light transmitting holes 311a in the first light shielding layer 31a, the period of the second light transmitting holes 311b in the second light shielding layer 31b, and the period of the third light transmitting holes 311c in each third light shielding layer 31c are equal to each other. The center of a first light transmitting hole 311a, the center of the second light transmitting hole 311b corresponding to the first light transmitting hole 311a, and the center of the third light transmitting hole 311c corresponding to the first light transmitting hole 311a are located on a same straight line (i.e., the central axis of the corresponding light transmitting channel).

Referring to FIG. 2c, the at least one third light shielding layer 31c may also include two or more third light shielding layers 31c in an embodiment of the present disclosure. In principle, the larger the number of the at least one third light shielding layer 31c is, the better the performance of a structure formed by a plurality of third light shielding layers 31c in preventing crosstalk is, and meanwhile, the smaller the period P of the first light transmitting holes 311a in the first light shielding layers 31a and/or the second light transmitting holes 311b in the second light shielding layers 31b may be set. However, the larger the number of the third light shielding layers 31c is, the larger number of the processes for forming the third light shielding layers 31c and the light transmitting layers 32 is, and the longer the manufacturing cycle of a product is. The number of the third light shielding layers 31c in an embodiment of the present disclosure is less than or equal to 3, in consideration of the performance of preventing the light crosstalk and the manufacturing process.

Figure 2D:
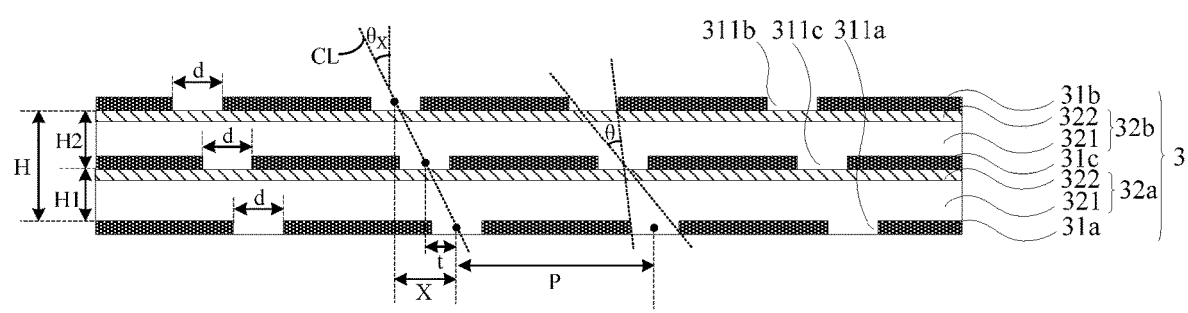
FIG. 2d is a schematic structural diagram of a light path structure shown in FIG. 2b.

As a specific example, referring to FIG. 2d, the at least one third light shielding layer 31c includes one third light shielding layer 31c. The light transmitting layer 32 between the third light shielding layer 31c and the first light shielding layer 31a is a first light transmitting layer 32a, and the light transmitting layer 32 between the third light shielding layer 31c and the second light shielding layer 31b is a second light transmitting layer 32b. A thickness H1 of the first light transmitting layer 32a is greater than a thickness H2 of the second light transmitting layer 32b.

In some embodiments, each of the first light transmitting holes 311a, the second light transmitting holes 311b, and the third light transmitting holes 311c has a same diameter d in the range of 2 um to 10 um. The period P of the first light transmitting holes 311a, the period P of the second light transmitting holes 311b, and the period P of the third light transmitting holes 311c are equal to each other and in the range from 10 um to 100 um. The thickness H1 of the first light transmitting layer 32a is in the ranges from 10 um to 20 um, and the thickness H2 of the second light transmitting layer 32b ranges from 5 um to 15 um.

A distance between an orthogonal projection of the center of a first light transmitting hole 311a on the substrate 1 and an orthogonal projection of the center of the third light transmitting hole 311c corresponding to the first light transmitting hole 311a on the substrate 1 is t, and a distance between the orthogonal projection of the center of the first light transmitting hole 311a on the substrate 1 and an orthogonal projection of the center of the second light transmitting hole 311b corresponding to the first light transmitting hole 311a on the substrate 1 is X, where t and X satisfy the relationship of $t/X=H1/H=H1/(H1+H2)$.

As an example, the inclination angle θx of the central axis CL of each light transmitting channel satisfies the equation of $\theta x=45°$. The diameter d of each of the light transmitting holes 311a, 311b, and 311c in the respective light shielding layers 31a, 31b, and 31c satisfies the equation of $d=6$ um. The period P of the light transmitting holes 311a, 311b, or 311c in the respective light shielding layers 31a, 31b, or 31c satisfies the equation of $P=50$ um. The thickness H1 of the first light transmitting layer 32a satisfies the equation of $H1=15$ um, and the thickness H2 of the second light transmitting layer 32b satisfies the equation of $H2=10$ um.

The equation of $\theta \approx 10°$ can be obtained from the equation of $\theta=\arctan(X+d)/H - \arctan(X-d)/H$.

The equation of $X=25$ um can be obtained from the equation of $X=H*\tan\theta x$.

The equation of $t=14$ um can be obtained from the equation of $t=X*H1/H$.

In the texture recognition assembly according to any one of the foregoing embodiment of the present disclosure, it only needs to form the optical sensing structure 2 on the substrate 1, and then directly form at least two light shielding layers and the light transmitting layer that have relatively simple structure on the optical sensing structure 2, to realize an excellent collimation effect. Further, a resultant device has a lighter and thinner structure, and the difficulty of a manufacturing process of the device can be reduced. The problem of low product yield such as foaming and the like caused by attaching a light path structure to the texture recognition assembly by using an optically clear adhesive (OCA) can be avoided. Further, since layers are directly formed on the optical sensing structure 2 to form the light path structure 3, the light path structure 3 can be formed by using a device that is commonly used for forming a layer on an array substrate, and thus addition of a new manufacturing device is not necessary.

In the texture recognition assembly according to an embodiment of the present disclosure, referring to FIGS. 2a to 2c, the optical sensing structure 2 is generally disposed only in the texture recognition region A (which generally corresponds to a display region of the display panel), and wires extending from the texture recognition region A are disposed in the peripheral region B; a binding electrode 7 is disposed in the binding region C, and a surface of the binding electrode 7 needs to be exposed so as to be fixed to a driver chip. Since the light path structure 3 serves to collimate the light to be received by the optical sensing structure 2, the layers of the light path structure 3 need to cover the optical sensing structure 2 and not cover the binding electrode 7 in the binding region C.

In the above texture recognition assembly according to an embodiment of the present disclosure, referring to FIGS. 3a to 3d, the optical sensing structure 2 includes a plurality of optical sensors 21 arranged in an array, and a driving transistor 22 for driving an optical sensor 21. Each optical sensor includes a PIN photodiode and a PN photodiode, and the PIN photodiode includes a second electrode 213, a first electrode 211, and a semiconductor layer 212 located between the second electrode 213 and the first electrode 211. The first electrode 211 is electrically connected to the driving transistor 22, so that the driving transistor 22 can control a voltage applied to the first electrode 211, thereby controlling an operating state of the optical sensor 21. The semiconductor layer 212 includes a P-type semiconductor layer and an N-type semiconductor layer (e.g., an N-type Si layer) which are stacked together, or includes a P-type semiconductor layer (e.g., a P-type Si layer), an intrinsic semiconductor layer (e.g., an intrinsic Si layer), and an N-type semiconductor layer (e.g., an N-type Si layer) which are stacked together. For example, an I layer includes a-Si material, the P layer includes a material of a-Si doped with B ions, and the N layer includes a material of a-Si doped with P ions. In some embodiments, the second electrode 213 is a transparent electrode, which may include a transparent metal oxide such as Indium Tin Oxide (ITO), Indium Zinc Oxide (IZO), Gallium Zinc Oxide (GZO), or the like. The first electrode 211 is a metal electrode, which may include a material of metal such as copper (Cu), aluminum (Al), or titanium (Ti), or the like, or may include a material of metal alloy. The driving transistor 22 includes a gate electrode 221, a gate insulating layer 222, an active layer 223, and a source-drain electrode 224 (including a source electrode and a drain electrode spaced apart from each other).

It should be noted that in an embodiments of the present disclosure, a structure being "transparent" means that the structure is light transmissive, but not means that the structure has a light transmittance of 100%.

Figure 3A:
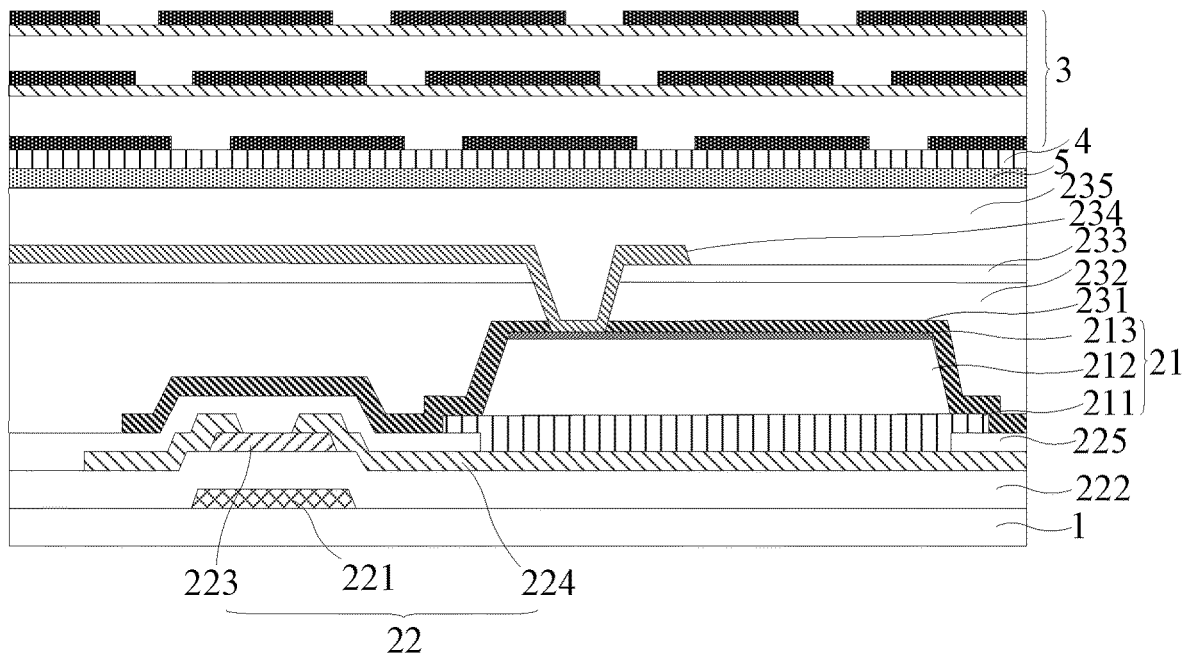
FIG. 3a is a schematic diagram showing a structure of an optical sensor of a texture recognition assembly according to an embodiment of the present disclosure.
Figure 3B:
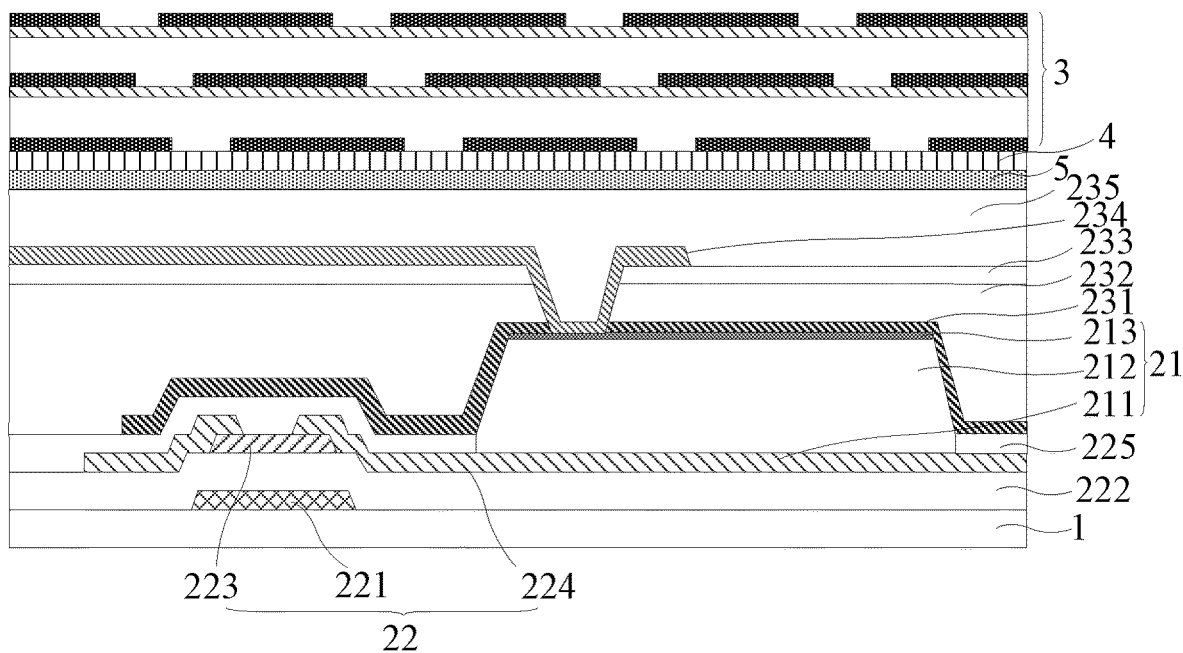
FIG. 3b is a schematic diagram showing another structure of an optical sensor of a texture recognition assembly according to an embodiment of the present disclosure.
Figure 3C:
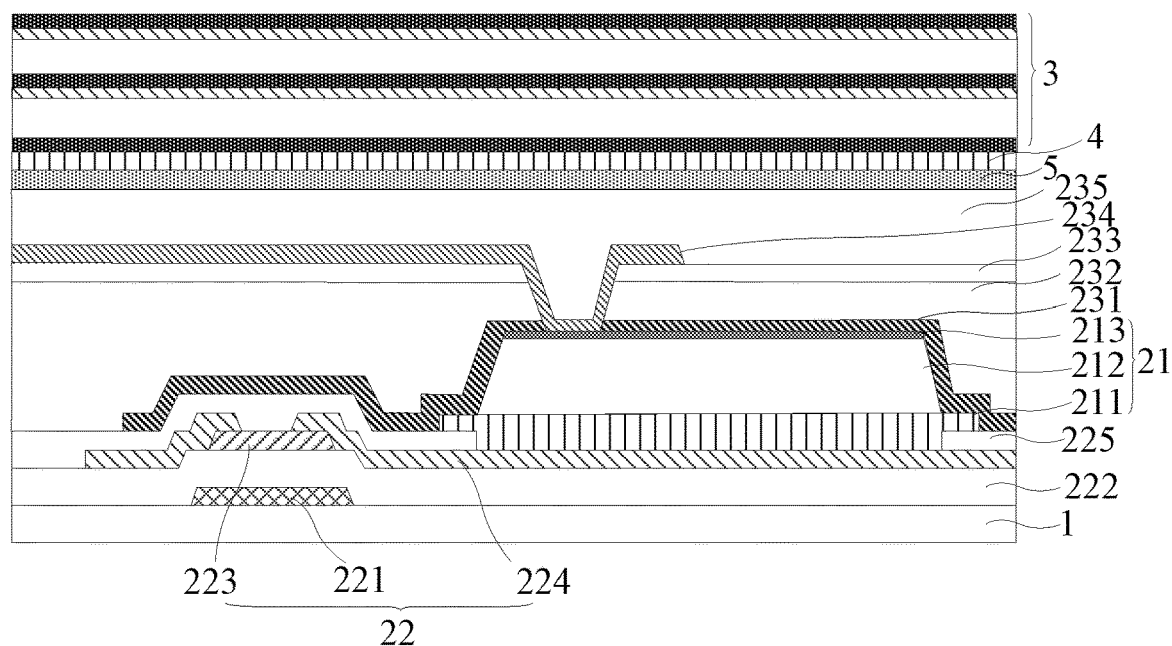
FIG. 3c is a schematic diagram showing still another structure of an optical sensor of a texture recognition assembly according to an embodiment of the present disclosure.
Figure 3D:
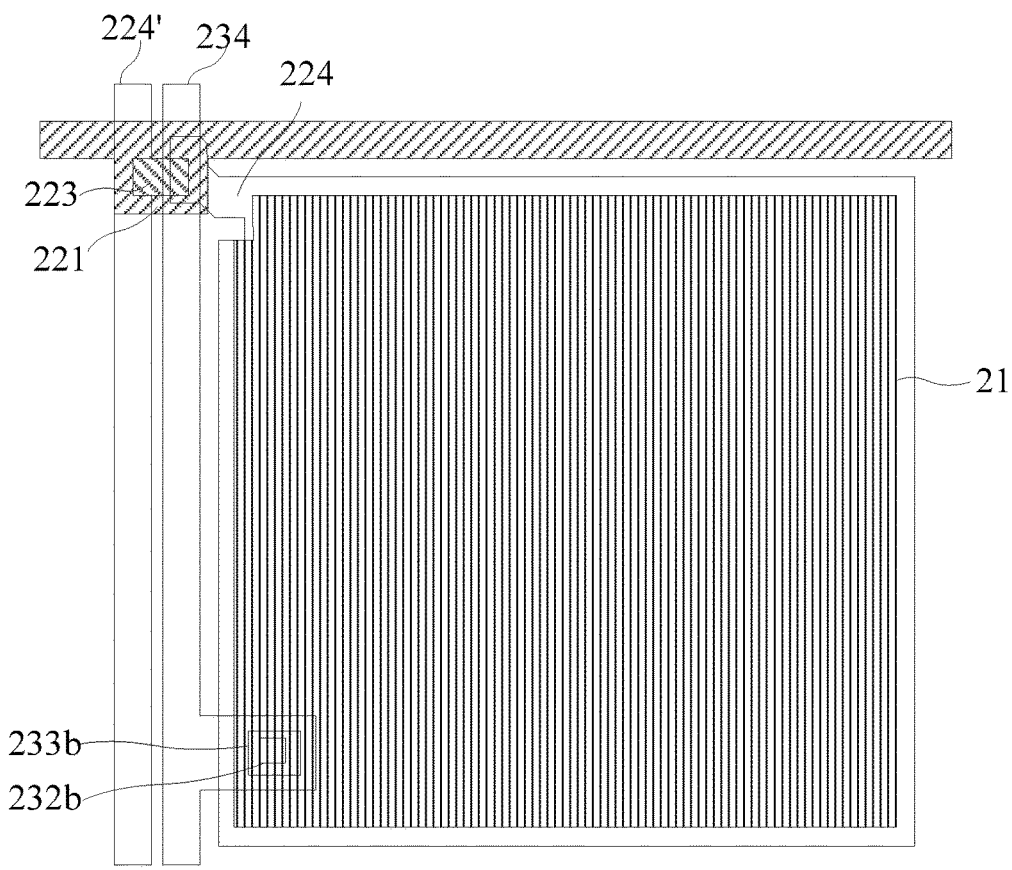
FIG. 3d is a schematic top view of an optical sensor of a texture recognition assembly according to an embodiment of the present disclosure.

Specifically, the optical sensing structure 2 includes the gate electrode 221, the gate insulating layer 222, the active layer 223, the source-drain electrode 224, a first insulating layer 225, the first electrode 211, the semiconductor layer 212, the second electrode 213, a protective layer 231 (which typically includes a transparent insulating material), a second insulating layer 232, a passivation layer 233, a bias voltage line 234, and a blocking layer 235, which are sequentially stacked on the substrate 1. Further, the source-drain electrode extend to the side of the PIN photodiode, and an orthogonal projection of the source-drain electrode 224 on the substrate 1 may completely cover and be greater than an orthogonal projection of the first electrode 211 on the substrate 1 by a margin, so as to increase a photosensitive region. Correspondingly, the process for forming the layers in the texture recognition region A by using a mask includes forming the following: the gate electrode 221→the gate insulating layer 222→the active layer 223→the source-drain electrode 224→the first insulating layer 225→the first electrode 211→PIN 212→the second electrode 213→the second insulating layer 232→the passivation layer 233→the bias voltage line 234→the blocking layer 235, and the like. For example, a pattern of a data line 224' is further provided in a layer where the source-drain electrode 224 is located, and the second insulating layer 232 and the passivation layer 233 may be subjected to patterning processes, respectively, so that through holes in the two layers may have different sizes. FIG. 3d is a schematic top view of an optical sensor 21 and a driving transistor 22, and it can be seen from FIG. 3d that a through hole 233b in the passivation layer 233 is larger than a through hole 232b in the second insulating layer 232 in size. A structure of the optical sensing structure 2 is not limited to the specific structure shown in FIG. 3a, and may alternatively be that shown in FIG. 3b, in which the source-drain electrode 224 and the first electrode are combined with each other as a same layer, i.e., the source-drain electrode 224 and the first electrode may have a one-piece structure. That is, the source-drain electrode extends to the side of the PIN photodiode, and is multiplexed as (or serves as) the first electrode of the PIN photodiode.

In an embodiment of the present disclosure, one optical sensor 21 corresponds to a plurality of first light transmitting holes 311a, and one first light transmitting hole 311a corresponds to one optical sensor 21. Light emitted from one first light transmitting hole 311a propagates to the optical sensor 21 corresponding the one first light transmitting hole 311.

In some embodiments, an orthogonal projection of each optical sensor 21 on the substrate 1 is a square with a length D of each side, and the period of the first light transmitting holes 311a is P, where D and P satisfy the relationship of D=N*P, N being a positive even number. Such an arrangement can make the number of the first light transmitting holes 311a (or the light transmitting channels CL) corresponding to each optical sensor 2 be a constant, thereby ensuring uniformity of the light received by each optical sensor 2.

In some embodiments, due to limitation of a manufacturing process, the length D ranges from 10 um to 200 um; further, a PPI of each optical sensor 21 generally ranges from 200 to 500, and the period P of the light transmitting holes in each light shielding layer in the light path structure 3 ranges from 10 um to 100 um. Therefore, one optical sensor 21 corresponds to a plurality of light transmitting holes (e.g., several light transmitting holes to several hundreds of light transmitting holes) in each light shielding layer.

Figure 4:
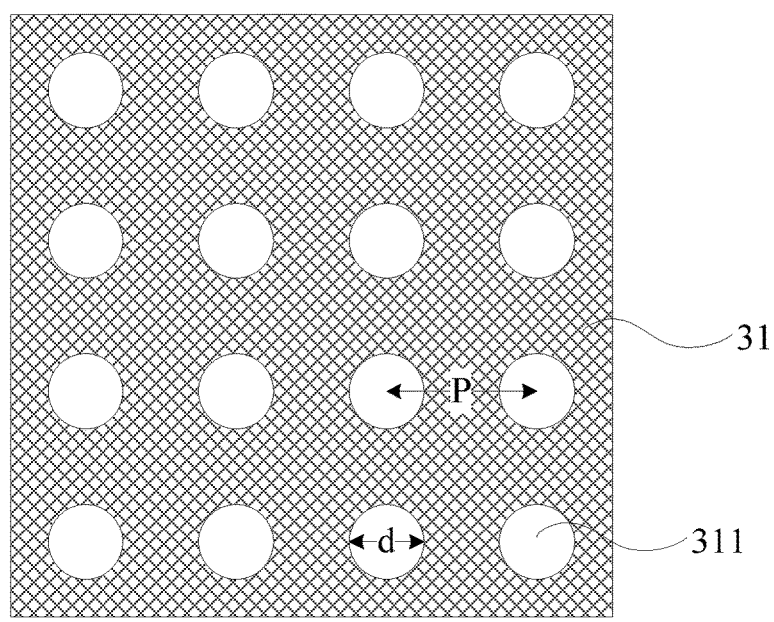
FIG. 4 is a schematic diagram showing an arrangement of light transmitting holes in a texture recognition assembly according to an embodiment of the present disclosure.
Figure 5:
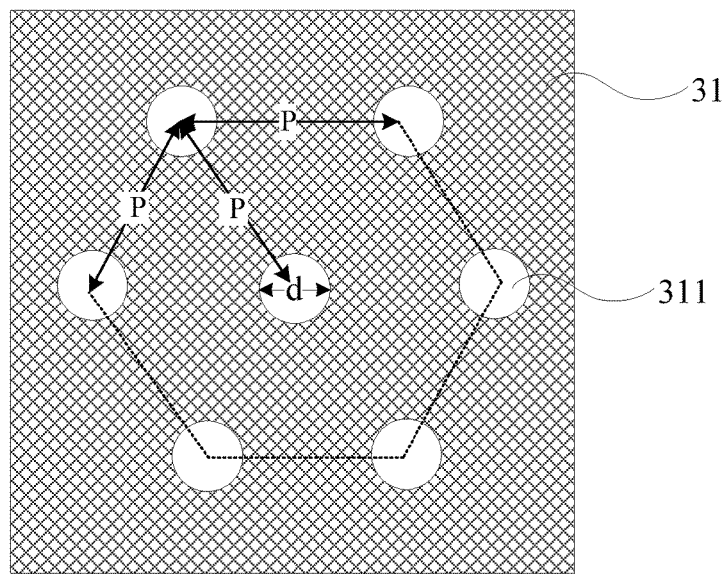
FIG. 5 is a schematic diagram showing another arrangement of light transmitting holes in a texture recognition assembly according to an embodiment of the present disclosure.

Referring to FIG. 4, the light transmitting holes 311 in a light shielding layer 31 may be arranged in a matrix, i.e., are arranged to be aligned with each other in both a row direction and a column direction. The light transmitting holes 311 in the light shielding layer 31 may alternatively be arranged in a hexagonal shape, as shown in FIG. 5. Apparently, in an embodiment of the present disclosure, the light transmitting holes 311 may also be arranged in other manners, and each of the light transmitting holes 311 may have a shape of a circle or a square, which is not limited herein.

Specifically, in the texture recognition assembly according to any one of the foregoing embodiments of the present disclosure, the light shielding layer 31 may be made of a material with a high light shielding capability, such as a black resin, for example, a BM (black matrix). Light shielding layers 31 may generally have identical process parameters, may generally have a thickness ranging from 500 angstroms to 16,000 angstroms, and should have an OD value not less than 3. For example, the OD value means a light transmittance of a layer, the OD value=1 means that the light transmittance of the layer is 10%, the OD value=2 means that the light transmittance of the layer is 1%, the OD value=3 means that the light transmittance of the layer is 0.1%, and the OD value=4 means that the light transmittance of the layer is 0.01%. That is, the larger the OD value is, the better the light shielding effect of the layer is. Specifically, the formation of each light shielding layer generally includes coating a layer on the substrate 1, and then forming the light transmitting holes by a photolithography process or a nano-imprinting process.

With continued reference to FIGS. 2a to 2d, in some embodiments, each light transmitting layer 32 may include a transparent resin layer 321 and a transparent inorganic insulating layer 322. Between any adjacent two of the light shielding layers, the transparent resin layer 321 is adjacent to the light shielding layer proximal to the substrate 1, and the transparent inorganic insulating layer 322 is adjacent to the light shielding layer distal to the substrate 1.

Specifically, the transparent resin layer 321 and the transparent inorganic insulating layer 322 in each light transmitting layer 32 may be formed by using an apparatus for forming a thin film encapsulation structure in an array substrate. That is, the transparent inorganic insulating layer 322 may be formed by using a Chemical Vapor Deposition (CVD) apparatus for forming an inorganic thin film encapsulation layer, and the transparent resin layer 321 may be formed by using an inkjet printing (IJP) apparatus for forming an organic thin film encapsulation layer. After a light shielding layer is formed, the transparent resin layer 321 may be formed first to ensure that the thickness required by the entire light transmitting layer 32 is generally in the order of micron, and then the transparent inorganic insulating layer 322 with a smaller thickness in the order of nanometer is formed on the transparent resin layer 321, where process parameters and the thickness of transparent inorganic insulating layers 322 are generally the same. The transparent resin layer 321 may be made of a resin material such as acrylic, and if a black resin material is directly coated on the resin material, a layer with a uniform thickness cannot be formed, which may cause problems such as local material aggregation, and the like. Therefore, the transparent inorganic insulating layer 322 is formed on the transparent resin layer 321, which can ensure the uniformity of a light shielding layer formed thereon.

Optionally, in the texture recognition assembly according to any one of the foregoing embodiments of the present disclosure, a material of the transparent inorganic insulating layer 322 may be silicon nitride or silicon oxynitride formed by a low temperature chemical vapor deposition method. For example, a temperature adopted in the low temperature chemical vapor deposition is about 80° C. Since each light shielding layer 31 and each transparent resin layer 321 are formed at a low temperature, the formation of the transparent inorganic insulating layer 322 by the low temperature chemical vapor deposition can prevent patterns of the underlying light shielding layer and the transparent resin layer 321 from being damaged by a high temperature environment.

Figure 6:
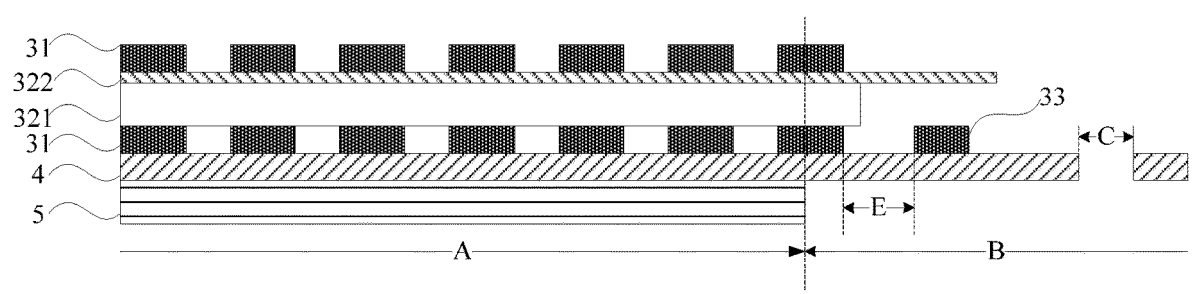
FIG. 6 is a schematic diagram showing yet another structure of a texture recognition assembly according to an embodiment of the present disclosure.

Referring to FIG. 6, in some embodiments, the light shielding layer 31 may extend from the texture recognition region A to a joint edge of the peripheral region B, i.e., the region covered by the light shielding layer 31 is larger than the texture recognition region A, so as to ensure that stray light is prevented from being incident on the optical sensing structure 2 from the peripheral region B. An orthogonal projection of the transparent resin layer 321 on the substrate 1 should completely cover an orthogonal projection of the adjacent light shielding layer 31 on the substrate 1, and the finally formed transparent resin layer 321 may overflow from an edge of the adjacent light shielding layer 31 due to the fluidity of a resin material during an actual manufacturing process. Thus, in order to ensure the thickness uniformity of the light shielding layer 31 formed subsequently at an edge portion of the light shielding layer 31, an orthogonal projection of the transparent inorganic insulating layer 322 formed on the transparent resin layer 321 on the substrate 1 should completely cover and be larger than the orthogonal projection of the adjacent transparent resin layer 321 on the substrate 1.

Figure 7:
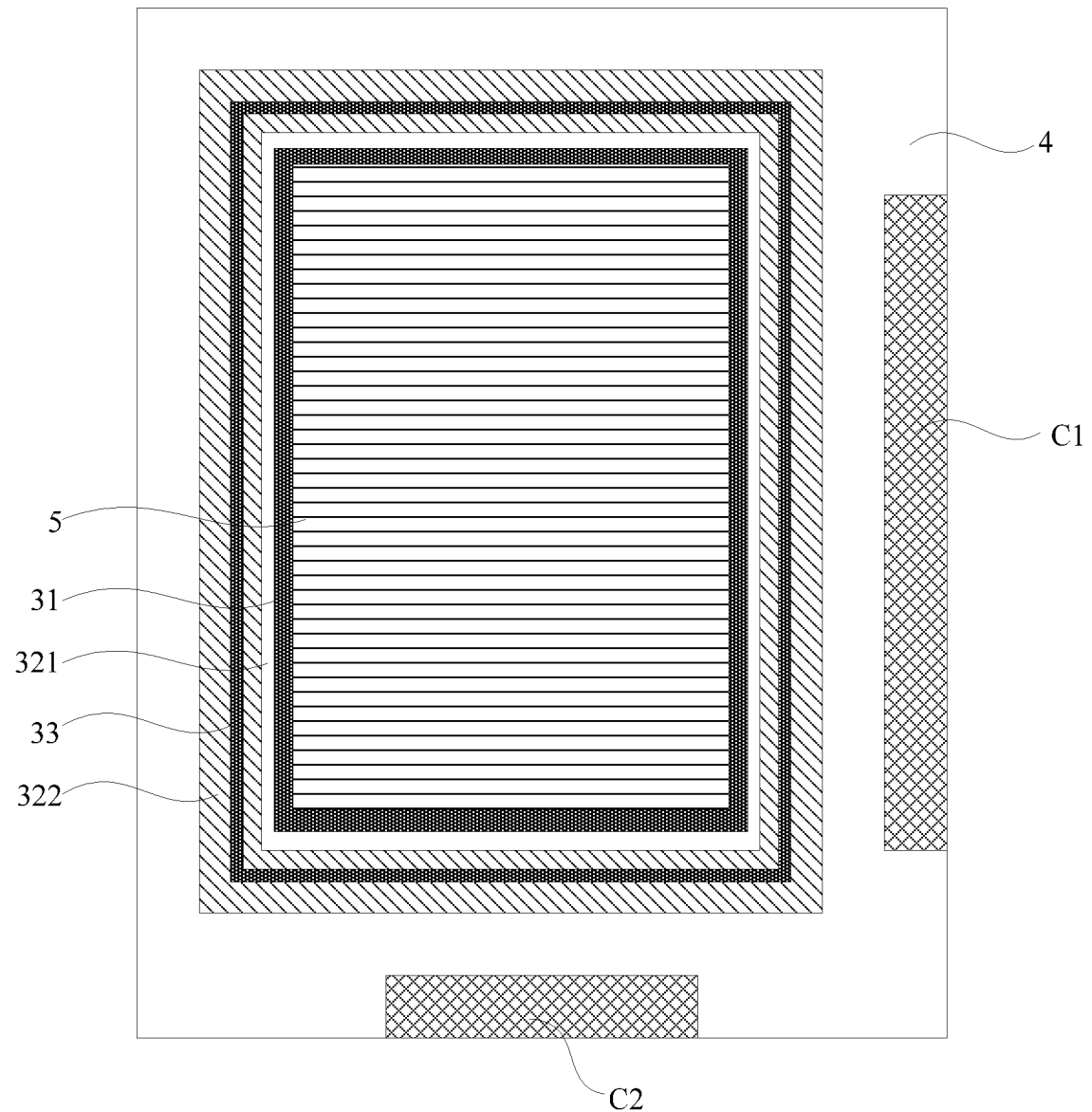
FIG. 7 is a schematic top view of a texture recognition assembly according to an embodiment of the present disclosure.

Referring to FIGS. 6 and 7, in some embodiments, the light path structure 3 may further include a blocking wall structure 33, which is disposed around the transparent resin layer 321, and is disposed in a same layer as and separately from the light shielding layer 31 adjacent to the transparent resin layer 321.

Specifically, when the light shielding layer 31 is formed, the blocking wall structure 33 is formed at a certain distance from the light shielding layer 31 to surround the light shielding layer 31 by one loop, and a gap between the light shielding layer 31 and the blocking wall structure 33 serves as an edge overflow region E of a subsequently formed transparent resin layer 321. The blocking wall structures 33 can block an edge of the transparent resin layer 321 from overflowing out of the blocking wall structures 33 when a material of the transparent resin layer 321 with certain fluidity is coated on the light shielding layer 31. In addition, since there may be a problem of edge overflow when each transparent resin layer 321 is formed, a blocking wall structure 33 may be formed while forming any light shielding layer 31 other than the light shielding layer 31 formed last.

With continued reference to FIGS. 3a to 3c and FIG. 6, in some embodiments, the texture recognition assembly may further include: a planarization layer 4 positioned between the light path structure 3 and the optical sensing structure 2, and the planarization layer 4 is arranged to have a continuous surface and has a hollow pattern only in the binding region C.

Specifically, after the optical sensing structure 2 is formed, the planarization layer 4 is formed first, which, on one hand, is beneficial to forming the light path structure 3 thereon subsequently, and on the other hand, can protect the layers covered thereunder. The planarization layer 4 is provided with the hollow pattern in the binding region C to expose the binding electrode 7, so as to facilitate subsequent binding of the driver chip. Hollow patterns may be provided to be in one-to-one correspondence with binding electrodes 7, or only one hollow pattern may be provided in the whole binding region C, which is not limited herein.

Optionally, in the texture recognition assembly according to any one of the foregoing embodiments of the present disclosure, the planarization layer 4 is generally made of an inorganic insulating material, for example, a material of silicon oxide ($SiO_2$) or silicon nitride (SiN) may be used, where silicon nitride has a good film-forming compactness, which is beneficial to the uniformity of the film-forming of the first light shielding layer 31 of the light path structure 3 on the planarization layer 4, and meanwhile, the underlying structure of the first light shielding layer can be better protected from the influence of an etching solution when the first light shielding layer is etched. Since various layers of the optical sensing structure 2 are formed by using a high temperature process, the planarization layer 4 may also be formed by using a high temperature process without damaging the underlying layers. Specifically, the planarization layer 4 may be formed by using a Plasma Enhanced Chemical Vapor Deposition (PECVD) apparatus, and a manufacturing temperature thereof may be about 230° C.

With continued reference to FIGS. 3a to 3c and FIG. 6, in some embodiments, the texture recognition assembly may further include a ground shielding layer 5 located between the planarization layer 4 and the optical sensing structure 2. The ground shielding layer 5 is adjacent to the planarization layer 4, and a pattern of the ground shielding layer 5 is covered by a pattern of the planarization layer 4. Further, an orthogonal projection of the ground shielding layer 5 on the substrate 1 covers an orthogonal projection of the optical sensing structure 2 on the substrate 1. Specifically, the ground shielding layer 5 covers the entire fingerprint recognition region, or only covers a photosensitive region in the fingerprint recognition region.

Referring to FIG. 6, the ground shielding layer 5 is generally disposed to have a continuous surface in the texture recognition region A, so as to prevent the optical sensing structure 2 from being electromagnetically interfered by an external environment, and the ground shielding layer 5 is generally made of ITO to ensure a certain light transmittance. The planarization layer 4 completely covers the ground shielding layer 5, to protect the ground shielding layer 5, and prevent the ground shielding layer 5 from being exposed in a hydrogen-rich environment in which indium ions in ITO will be replaced by hydrogen when layers of the light path structure 3 are subsequently formed in a chemical vapor deposition apparatus, thereby preventing the light transmittance of the ground shielding layer 5 from being reduced due to the atomization problem of the ground shielding layer 5.

Referring to FIGS. 8a to 8c and FIG. 9, the texture recognition region includes a photosensitive region A1, a spacer region A2, and a light shielding region A3, and the spacer region A2 is located between the photosensitive region A1 and the light shielding region A3. The optical sensing structure 2 is disposed in the photosensitive region A1 and the light shielding region A3, but has no pattern in the spacer region A2.

Figure 3E:
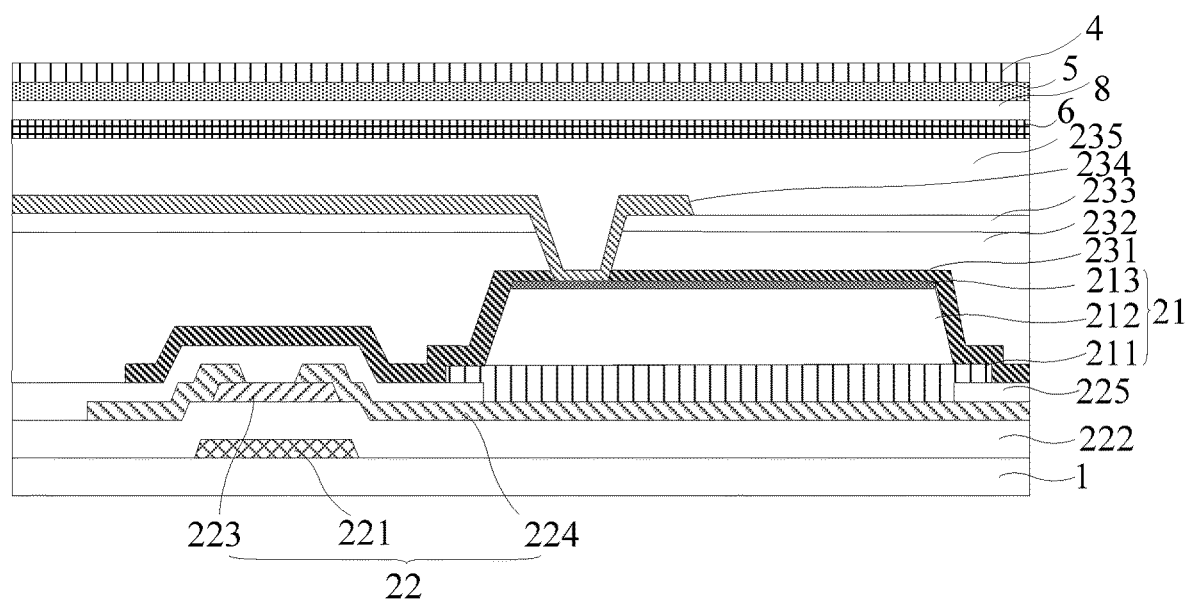
FIG. 3e is a schematic diagram showing yet another structure of an optical sensor of a texture recognition assembly according to an embodiment of the present disclosure.

Referring to FIG. 3e, in some embodiments, in order to perform noise reduction on an electrical signal output by an optical sensor 21 in the photosensitive region A1, a noise reduction metal layer 6 may be disposed in the light shielding region A3. Generally, the noise reduction metal layer 6 is disposed between the ground shielding layer 5 and the optical sensing structure 2, and a third insulating layer 8 is disposed between the ground shielding layer 5 and the noise reduction metal layer 6. The noise reduction metal layer 6 covers each optical sensor located in the light shielding region A3, so that the light shielding region A3 is always in a dark state. Since each optical sensor 21 in the light shielding region A3 is not exposed to light, an output signal output therefrom may serve as a noise signal (i.e., an electrical signal noise) for performing a noise removal process on a signal output from the photosensitive region A1. However, in order to form a pattern of the noise reduction metal layer, a special manufacturing process and a mask for performing a patterning process are required, which results in an increase in a manufacturing period and an increase in cost.

Figure 9:
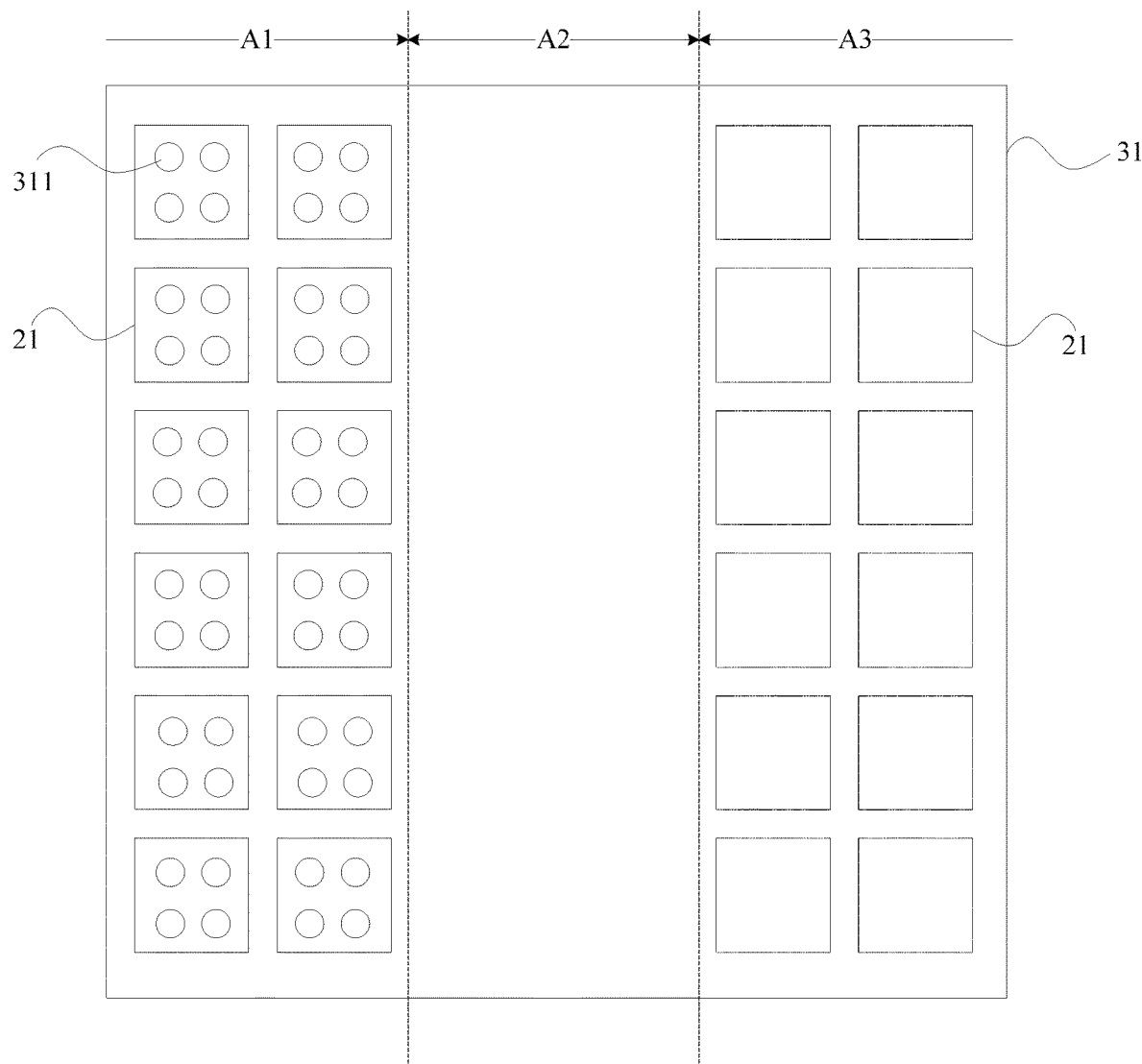
FIG. 9 is a schematic top view of a portion of a texture recognition region of a texture recognition assembly according to an embodiment of the present disclosure.

To solve the above technical problem, an embodiment of the present disclosure provides another solution. In some embodiments, an orthogonal projection of at least one light shielding layer on the substrate completely covers the light shielding region. For convenience of description, a portion, whose orthogonal projection on the substrate completely covers the light shielding region, of a light shielding layer is referred to as a noise reduction light-shielding portion M. The optical sensing structure 2 is disposed in the photosensitive region A1 and the light shielding region A3, but is not disposed in the spacer region A2. In FIG. 9, a plurality of optical sensors 21 disposed in an array in the photosensitive region A1 and the light shielding region A3 are shown as rectangular blocks. The noise reduction light-shielding portion M may cover the spacer region A2 and the light shielding region A3, and the ground shielding layer 5 covers the photosensitive region A1, the spacer region A2, and the light shielding region A3. That is, it can be understood that portions of the optical sensing structure 2 in the light shielding region A3 and the photosensitive region A1 are the same, and the difference between the light shielding region A3 and the photosensitive region A1 lies in that: the noise reduction light-shielding portion M of each light shielding layer in the light shielding region A3 is not provided with any light transmitting hole. FIG. 3c shows a portion of the optical sensing structure in the light shielding region A3, and FIG. 3a shows a portion of the optical sensing structure in the photosensitive region A1.

Due to the existence of the noise reduction light-shielding portion M, each optical sensor 21 in the light shielding region A3 is not exposed to light, and therefore the signal output from each optical sensor 21 in the light shielding region A3 can serve as a noise signal (i.e., an electrical signal noise) for performing a noise removal process on a signal output from the photosensitive region A1. In the present embodiment, a light shielding layer of the light path structure 3 is used for shielding the light shielding region A3, to replace the noise reduction metal layer in the related art, thereby effectively shortening the manufacturing period of a product and reducing the production cost of the product.

It should be noted that FIG. 3c illustrates a case where an orthogonal projection of each of the light shielding layers on the substrate completely covers the light shielding region A3, which is only for exemplary purposes and not intended to limit the scope of technical solutions of the present disclosure. In an embodiment of the present disclosure, it is within the scope of the present disclosure to separately provide a noise reduction metal layer (as shown in FIG. 3e) or to use a light shielding layer of the light path structure 3 (as shown in FIG. 3c) to shield the light shielding region A3.

In general, a read chip reads data at a cycle of 32 columns of optical sensors 21, and therefore, for the convenience of noise reduction processing, an integer multiple of 32 columns of optical sensors 21 may be provided in the light shielding region A3. No optical sensor 21 is disposed in the spacer region A2 disposed between the photosensitive region A1 and the light shielding region A3, and the spacer region A2 may have a width of at least 2 columns of optical sensors 21, so as to avoid mutual interference between a signal of the photosensitive region A1 and a signal of the light shielding region A3.

In an embodiment of the present disclosure, the light shielding region A3 may be disposed on at least one of a side of the photosensitive region A1 proximal to a binding region C1 of the gate driver chip, a side of the photosensitive region A1 distal to the binding region C1 of the gate driver chip, a side of the photosensitive region A1 proximal to a binding region C2 of a data driver chip, and a side of the photosensitive region A1 distal to the binding region C2 of the data driver chip. An orthogonal projection of the noise reduction light-shielding portion M arranged between the ground shielding layer 5 and the optical sensing structure 2 on the substrate 1 may be positioned on a side of the texture identification region A adjacent to the binding region C, to reduce the noise interference between the optical sensing structure 2 and a driver chip bound to the binding region C.

Figure 8A:
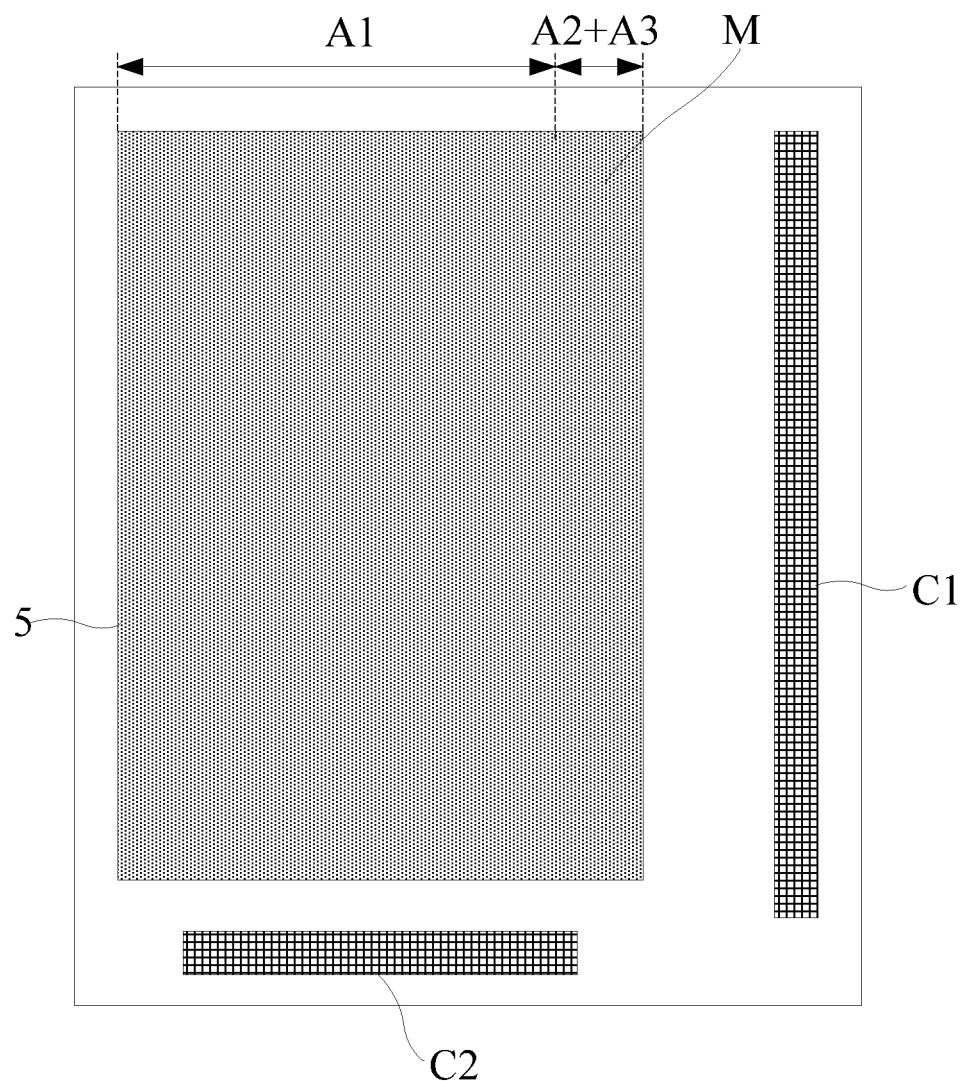
FIG. 8a is a schematic top view of another texture recognition assembly according to an embodiment of the present disclosure.
Figure 8B:
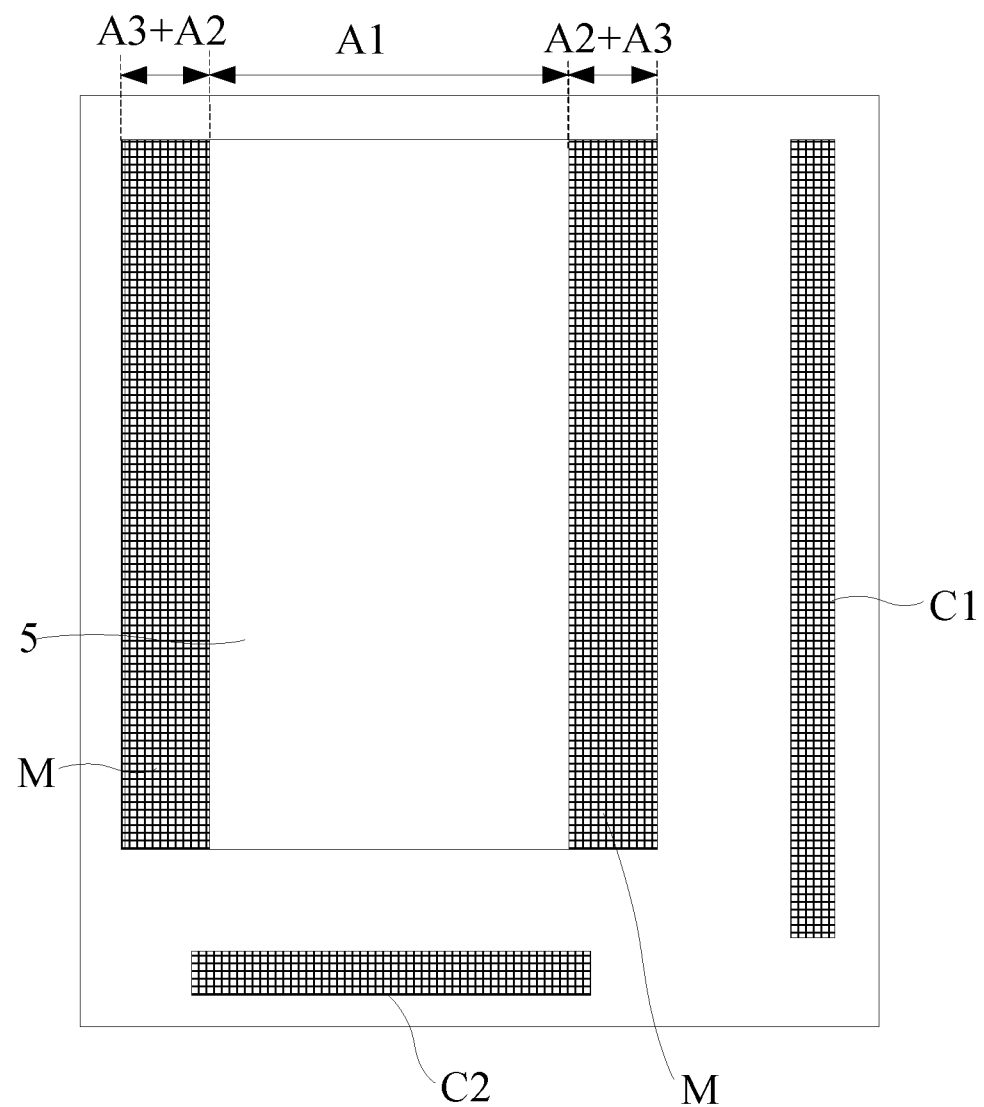
FIG. 8b is a schematic top view of still another texture recognition assembly according to an embodiment of the present disclosure.
Figure 8C:
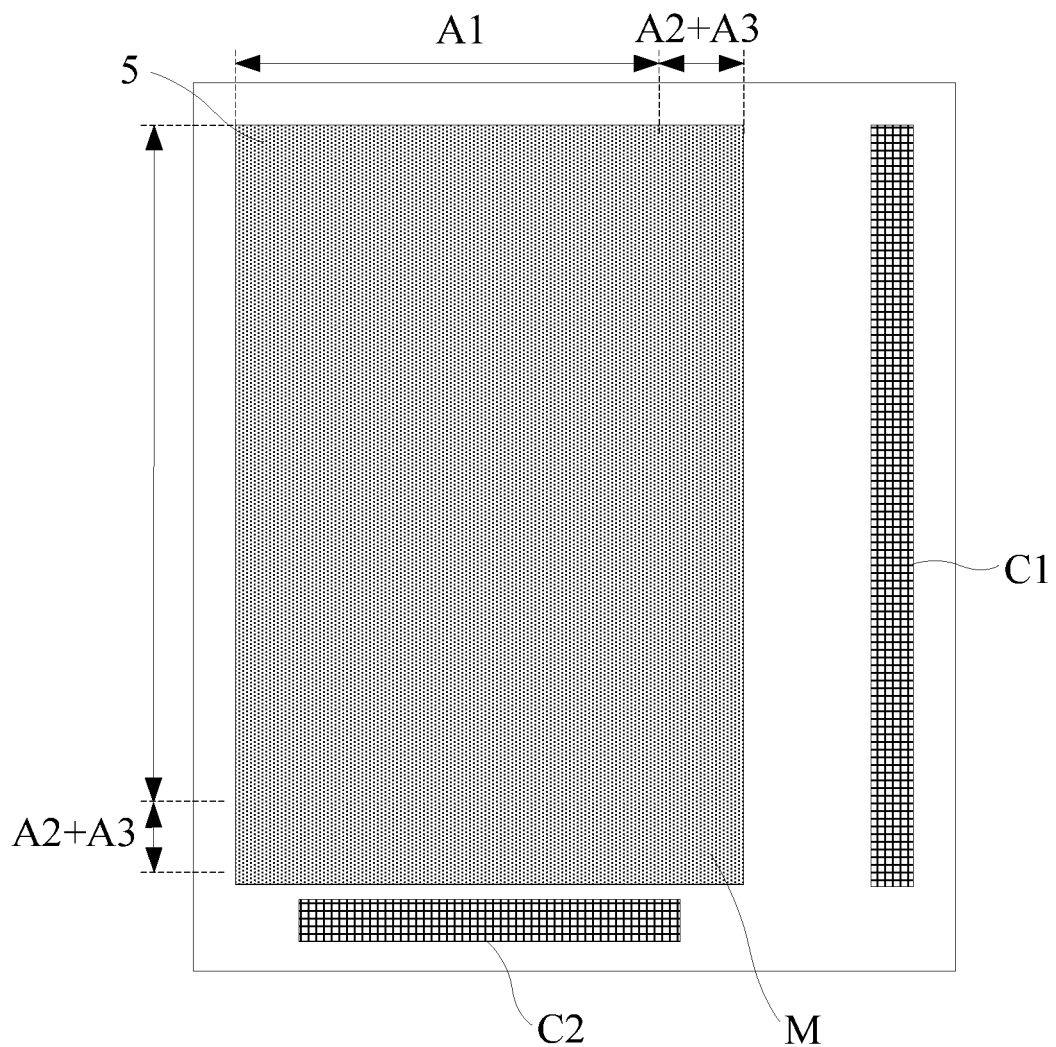
FIG. 8c is a schematic top view of yet another texture recognition assembly according to an embodiment of the present disclosure.

Referring to FIGS. 8a to 8c, in some embodiments, the light shielding region A3 may be located on one side or two opposite sides or two intersecting sides of the photosensitive region A1.

In an example, the bonding region C includes the bonding region C1 of the gate driver chip located at the right side of the texture recognition region A and the bonding region C2 of the data driver chip located at the lower side of the texture recognition region A. Referring to FIG. 8a, the light shielding region A3 is located on one side of the photosensitive region A1, specifically, on one side of the photosensitive region A1 proximal to the bonding region C1 of the gate driver chip (i.e., on the right portion of the texture recognition region A), and the pattern of the noise reduction light-shielding portion M is disposed in the right portion of the texture recognition region A. Referring to FIG. 8b, the light shielding regions A3 are located at two opposite sides of the photosensitive region A1. Specifically, two light shielding regions A3 are respectively located on a side of the photosensitive region A1 proximal to the binding region C1 of the gate driver chip and a side of the photosensitive region A1 distal to the binding region C1 of the gate driver chip (i.e., the right portion and the left portion of the texture recognition region A), and the pattern of the noise reduction light-shielding portion M is disposed in the left portion and the right portion of the texture recognition region A. Referring to FIG. 8C, the light shielding regions A3 are located at two intersecting sides of the photosensitive region A1, and specifically, two light shielding regions A3 are respectively located at the side of the photosensitive region A1 proximal to the bonding region C1 of the gate driver chip and a side of the photosensitive region A1 proximal to the bonding region C2 of the data driver chip (i.e., the right portion and a lower portion of the texture recognition region A), and the pattern of the noise reduction light-shielding portion M is disposed at the right portion and the lower portion of the texture recognition region A.

It should be noted that the positional relationship between the light shielding region A3 and the photosensitive region A1 shown in each of FIGS. 8a to 8c is only for illustrative purposes, and is not intended to limit the technical solutions of the present disclosure.

Referring to FIGS. 10a to 10e, in some embodiments, the texture recognition assembly further includes a binding electrode positioned in the binding region, and the binding electrode and the bias voltage line are positioned in a same layer. The layer where the bias voltage line is located is generally made of a material of metal, such as molybdenum (MO), titanium/aluminum/titanium (Ti/Al/Ti), or the like.

Figure 8D:
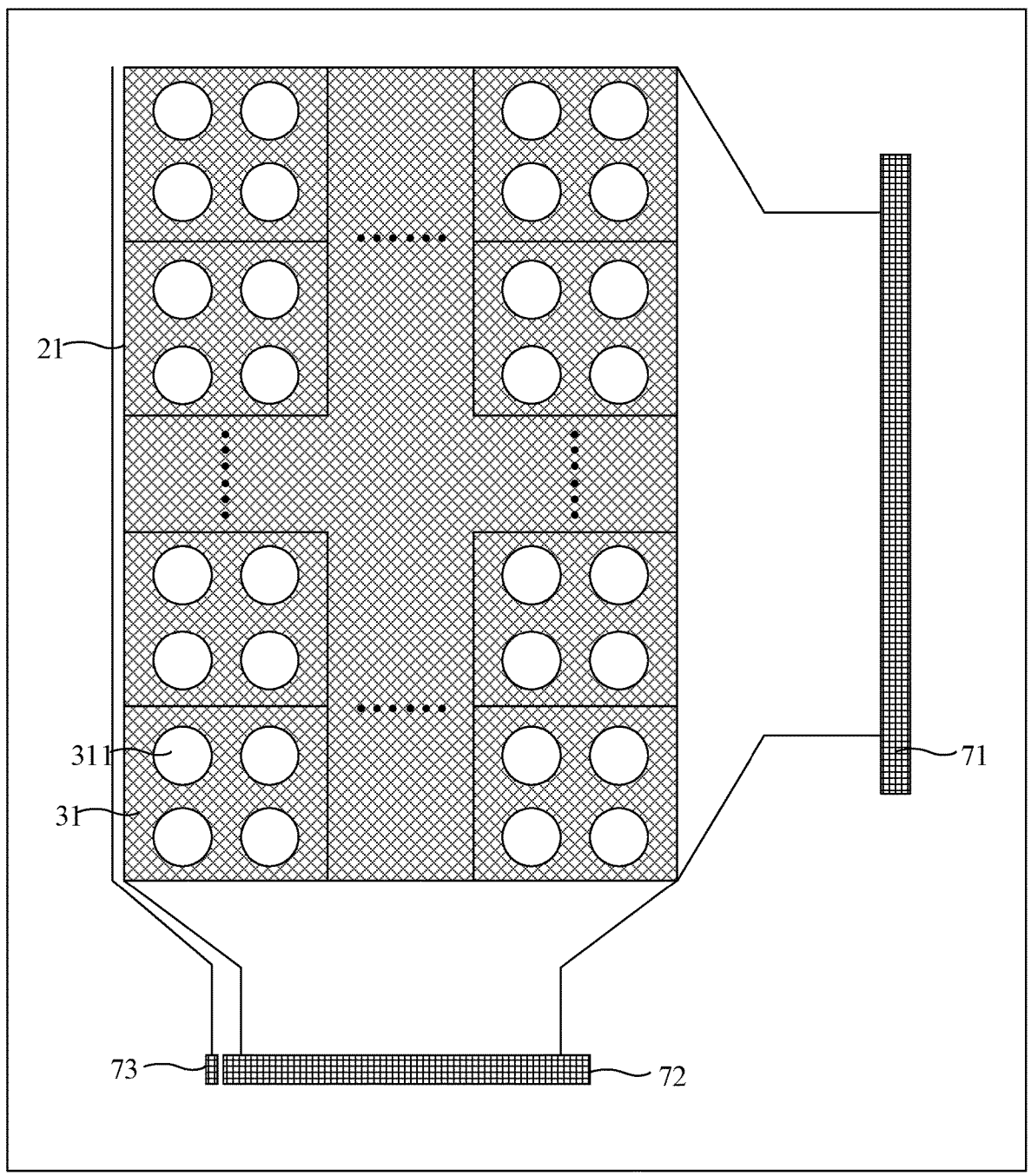
FIG. 8d is a schematic top view of another texture recognition assembly according to an embodiment of the present disclosure.

The binding region C1 of the gate driver chip located at the right side of the texture recognition region A is generally used for binding the gate driver chip, and the binding region C2 of the data driver chip located at the lower side of the texture recognition region A is generally used for binding the data driver chip which is also referred to as a data read chip. For convenience of description, referring to FIG. 8d, a binding electrode positioned in the binding region C1 of the gate driver chip is referred to as a first binding electrode 71, and binding electrodes positioned in the binding region C2 of the data driver chip are referred to as a second binding electrode 72 and a third binding electrode 73, respectively. The first binding electrode 71 is for supplying a signal to the gate electrode 221, the second binding electrode 72 is for connecting with the source-drain electrode 224, and the third binding electrode 73 is for supplying a signal to the bias voltage line 234.

In order to facilitate the connection between different binding electrodes and their corresponding components, corresponding connection electrodes may be disposed below the binding electrodes for connecting to the layers where the respective components to be connected are located.

Figure 10A:
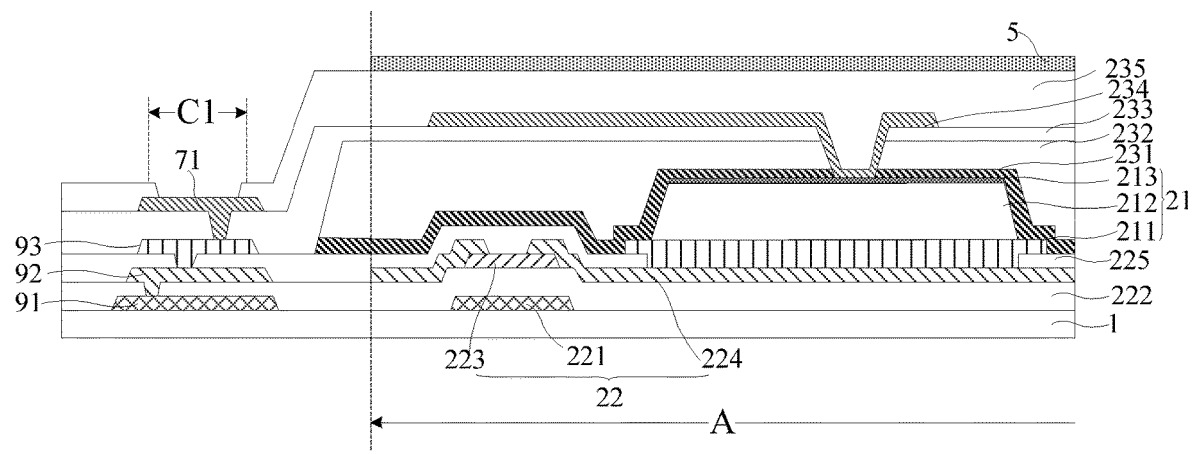
FIG. 10a is a schematic diagram showing still another structure of a texture recognition assembly according to an embodiment of the present disclosure.
Figure 10B:
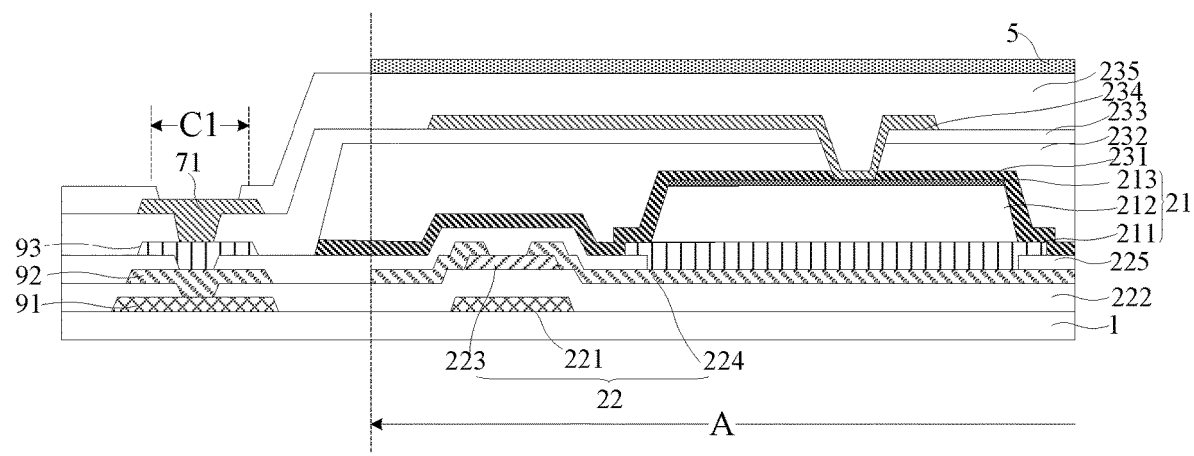
FIG. 10b is a schematic diagram showing yet another structure of a texture recognition assembly according to an embodiment of the present disclosure.
Figure 10C:
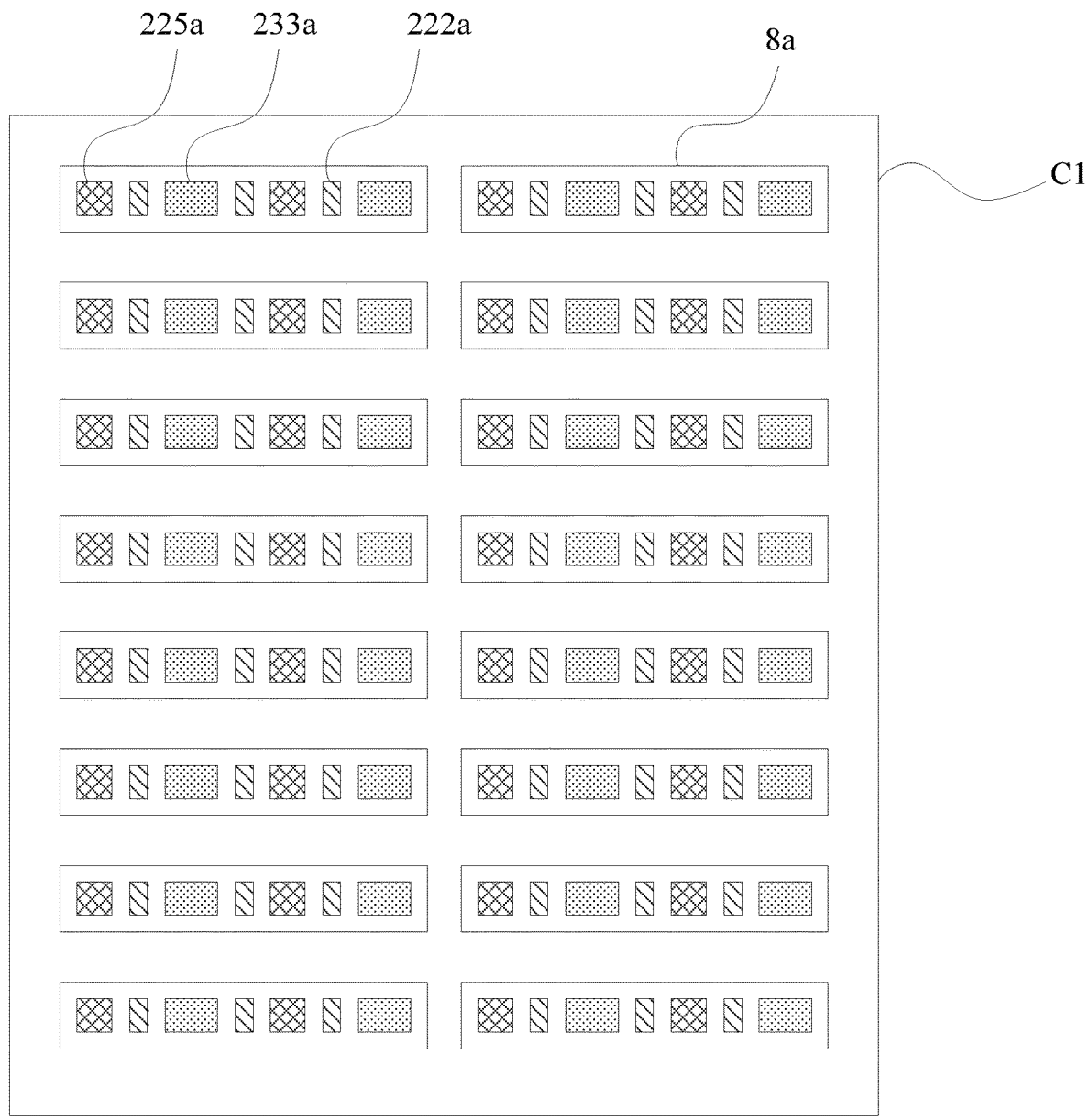
FIG. 10c is a schematic diagram showing a structure of a gate driver binding region of a texture recognition assembly according to an embodiment of the present disclosure.

Referring to FIGS. 10a to 10c, in some embodiments, a first connection electrode 91 located in a layer where the gate electrode 221 is located, a second connection electrode 92 located in a layer where the source-drain electrode 224 is located, and a third connection electrode 93 located in a layer where the first electrode 211 is located are provided between the first binding electrode 71 and the substrate 1. The first connection electrode 71 is electrically connected to the second connection electrode 92 through a first through hole 222a penetrating through the gate insulating layer 222. The second connection electrode 92 is electrically connected to the third connection electrode 93 through a second through hole 225a penetrating through the first insulating layer 225, and the third connection electrode 93 is electrically connected to the first binding electrode 71 through a third through hole 233a penetrating through the passivation layer 233. The first connection electrode 71 is electrically connected to the gate electrode 221 through a gate line and a gate line fan-out trace.

Referring to FIG. 10c, in some embodiments, each of the number of first through holes 222a, second through holes 225a, and third through holes 233a corresponding to one first bonding electrode 71 is at least two, and orthogonal projections of the first through holes 222a, the second through holes 225a, and the third through holes 233a on the substrate 1 do not overlap each other and are alternately arranged along an extension direction of the first bonding electrode 71. In addition, the blocking layer 235 is also provided therein with a binding through hole 8a for exposing the first binding electrode 71. Generally, one first binding electrode 71 corresponds to one binding through hole 8a, and an orthogonal projection of the binding through hole 8a on the substrate 1 covers orthogonal projections of the first through hole 222a, the second through hole 225a and the third through hole 233a on the substrate 1 at the same time. For example, providing multiple first through holes 222a, multiple second through holes 222a and multiple third through holes 233a can improve a rate (or probability) of good connection and reduce a resistance, and the alternate arrangement of the first, second and third through holes 222a, 225a and 233a can improve rate of good connection. Further, referring to FIG. 10b, an embodiment in which the first to third through holes overlap or partially overlap each other is also fall within the scope of the present disclosure.

Figure 10D:
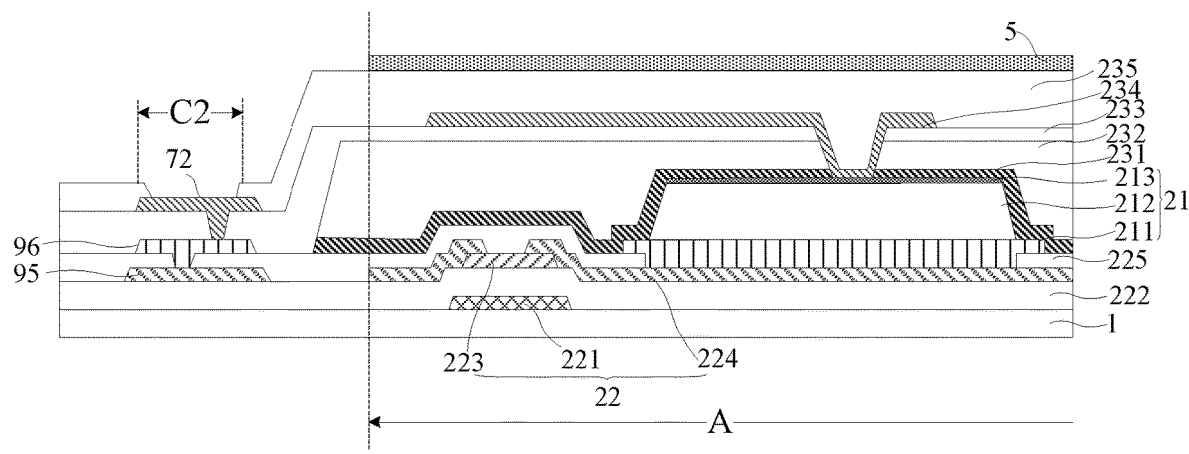
FIG. 10d is a schematic diagram showing still another structure of a texture recognition assembly according to an embodiment of the present disclosure.

Referring to FIG. 10d, in some embodiments, a fourth connection electrode 95 located in a layer where the source-drain electrode 224 is located and a fifth connection electrode 96 located in a layer where the first electrode 211 is located are provided between the second binding electrode 72 and the substrate 1. The fourth connection electrode 95 is electrically connected to the fifth connection electrode 96 through a fourth through hole penetrating through the first insulating layer 225, and the fifth connection electrode 96 is electrically connected to the second binding electrode 72 through a fifth through hole penetrating through the passivation layer 233. The fourth connection electrode 95 is electrically connected to the source-drain electrode 224 through a data line and a data line fan-out trace. Similar to the connection relationship between the first binding electrode 71 and the corresponding connection electrodes, the through holes corresponding to the second binding electrode 72 may be disposed alternately, and the number thereof may be two or more, detailed description thereof is omitted herein.

Figure 10E:
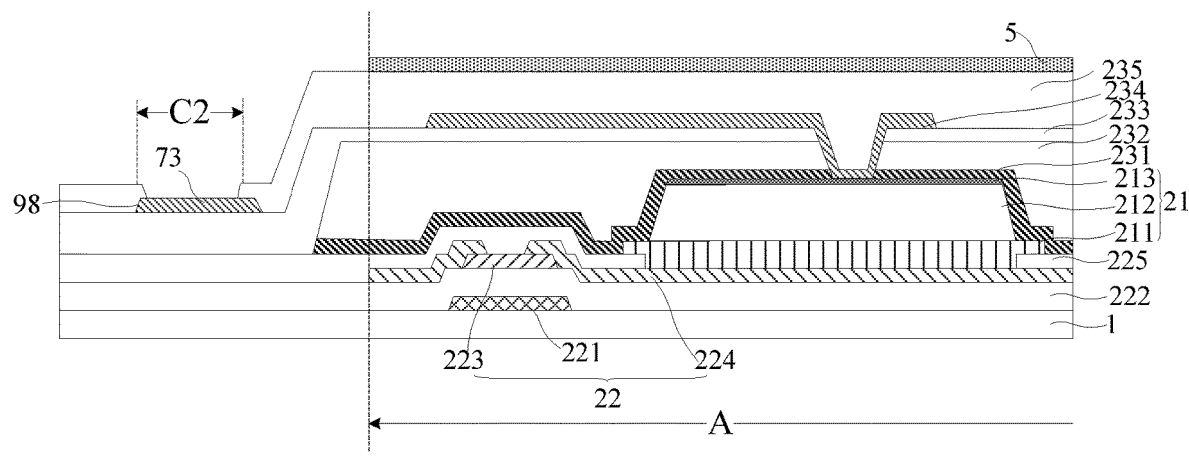
FIG. 10e is a schematic diagram showing yet another structure of a texture recognition assembly according to an embodiment of the present disclosure.

Referring to FIG. 10e, the third binding electrode 73 is electrically connected to the bias voltage line through a bias voltage fan-out trace.

In order to further reduce the influence of the pigment light excited by the ambient light after passing through a fingerprint on the accuracy of recognizing a texture, in an embodiment of the present disclosure, a light filter layer is disposed on a side of the semiconductor layer 212 distal to the substrate. The light filter layer may cause a central wavelength of the light passing through the light filter layer to be less than 600 nm, i.e., the light filter layer can effectively filter out the light having a wavelength greater than 600 nm. In other words, light having a wavelength less than 600 nm can pass through the light filter layer.

Figure 10F:
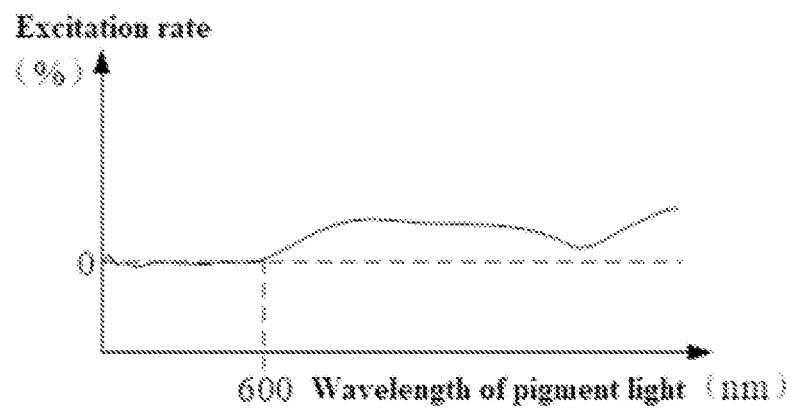
FIG. 10f shows a correspondence relationship between wavelengths of pigment light (or light of colors) excited by a finger and the excitation rates thereof when ambient light passes through the finger, according to an embodiment of the present disclosure.

Referring to FIG. 10f, the horizontal axis shown in FIG. 10f represents a wavelength of the pigment light excited by a texture in nanometers (nm), and the vertical axis shown in FIG. 10f represents an excitation rate in % (i.e., percent). The excitation rate for a wavelength indicates a probability by which the texture excites the pigment light of the wavelength. As can be seen from FIG. 10f, the wavelength of the pigment light excited by the texture is approximately 600 nm or more. Therefore, in an embodiment of the present disclosure, the light filter layer is arranged to filter out wavelengths greater than 600 nm, so that most of pigment light can be filtered out by the light filter layer, and interference of the pigment light on recognition of the texture is reduced.

Figure 10G:
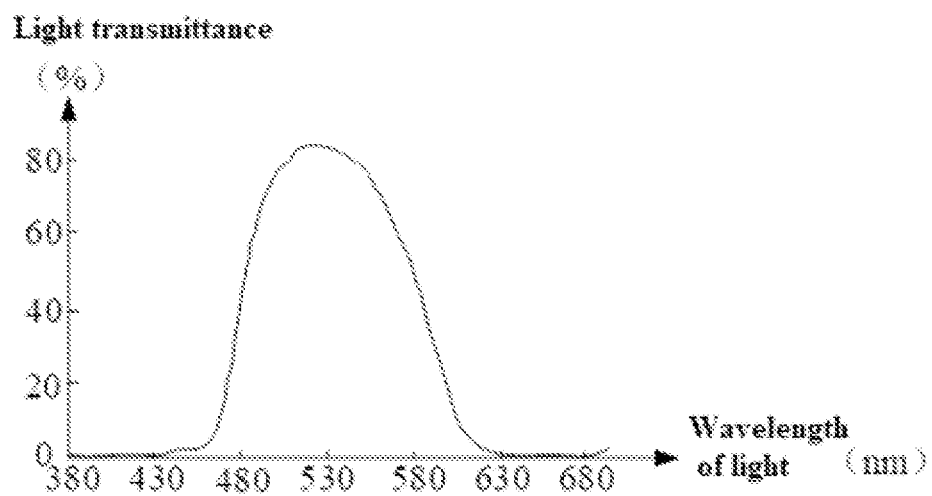
FIG. 10g is a schematic diagram showing light transmittances of a light filter layer according to an embodiment of the present disclosure.

In some embodiments, the light filter layer is configured to transmit light having a wavelength ranging from 480 nm to 580 nm, i.e., a central wavelength of the light transmitted through the light filter layer may be between 480 nm and 580 nm. As an example as shown in FIG. 10g, in which the horizontal axis represents a wavelength of light in nm, and the vertical axis represents a light transmittance of the light filter layer in %. As can be seen from FIG. 10g, the wavelength of the light transmitted through the light filter layer is mainly between 480 nm and 580 nm.

In the present embodiment, the light filter layer is disposed on the side of the semiconductor layer 212 distal to the substrate to filter out most of the pigment light excited by a texture, so as to reduce the pigment light incident on the semiconductor layer 212. Therefore, the interference degree of the pigment light on the recognition of a texture is reduced, thereby improving the accuracy of recognizing the texture.

In some embodiments, a material of the light filter layer includes a resin material having a light filtering function and effectively filtering out light having a wavelength more than 600 nm. As an example, the resin material may be the same as a material of a green color resist (i.e., a green photoresist).

Referring to FIGS. 2a to 3c, in some embodiments, a material of the second insulating layer 232 includes a resin material having a light filtering function, and the light filter layer and the second insulating layer 232 are multiplexed and combined into a same layer (i.e. the second insulating layer 232 is multiplexed as (or also serves as) the light filter layer); and/or, a material of the blocking layer 235 includes a resin material having a light filtering function, and the light filter layer and the blocking layer 235 are multiplexed and combined into a same layer (i.e., the blocking layer 235 is multiplexed as (or also serves as) the light filter layer);

and/or, the light transmitting layer includes the transparent resin layer 321 and the transparent inorganic insulating layer 322, and between any adjacent two light shielding layers, the transparent resin layer is adjacent to the light shielding layer proximal to the substrate, the transparent inorganic insulating layer 322 is adjacent to the light shielding layer distal to the substrate, a material of the transparent resin layer 321 includes a resin material having a light filtering function, and the light filter layer and the transparent resin layer 321 are multiplexed and combined into a same layer (i.e., the transparent resin layer 321 is multiplexed as (or also serves as) the light filter layer).

Alternatively, in an embodiment of the present disclosure, the light filter layer may also be provided as a separate layer different from the second insulating layer 232 or the blocking layer 235 or the transparent resin layer 321, which is not shown in the drawings.

Figure 11:
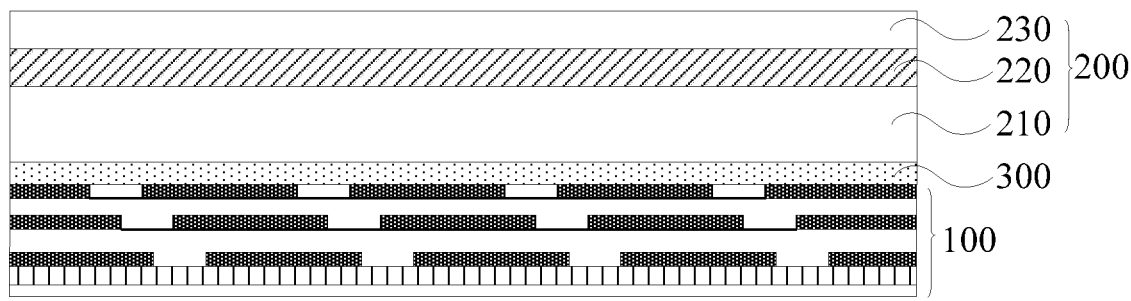
FIG. 11 is a schematic diagram showing a structure of a display device according to an embodiment of the present disclosure.

Referring to FIG. 11, based on the same inventive concept, an embodiment of the present disclosure provides a display device, which includes the texture recognition assembly 100 according to any one of the foregoing embodiments, and a display panel 200 located above the texture recognition assembly 100. For example, the display panel 200 and the texture recognition assembly 100 are fixed together by an optically clear adhesive (OCA) 300.

Specifically, in the display device according to an embodiment of the present disclosure, after the optical sensing structure 2 is formed on the substrate 1 in the texture recognition assembly 100, at least two light shielding layers and a light transmitting layer that have a relatively simple structure are directly formed on the optical sensing structure 2, to achieve a better collimation effect. Further, the resultant device has a thin and light structure, and the difficulty of a manufacturing process of the device is reduced. The problem of low product yield such as foaming and the like caused by attaching a light path structure to the texture recognition assembly by using an optically clear adhesive (OCA) can be avoided. Further, since layers are directly formed on the optical sensing structure 2 to form the light path structure 3, the light path structure 3 can be formed by using a device that is commonly used for forming a layer on an array substrate, and thus addition of a new manufacturing device is not necessary.

In some embodiments, the display panel 200 may be an Organic Light Emitting Diode (OLED) display panel, a Quantum dot Light Emitting Diode (QLED) display panel, or the like, which is not particularly limited in an embodiment of the present disclosure. The OLED display panel may be, for example, a flexible OLED display panel. For example, the OLED display panel and the QLED display panel have self-luminous characteristics, and the light emission of a display pixel unit thereof may be controlled or modulated as needed, which is beneficial to acquiring a texture and improving the integration level of a device.

The OLED display panel generally includes a flexible OLED display back plate 210, a polarizer 220, and a protective cover plate 230, which are sequentially stacked in a direction away from the texture recognition assembly. The protective cover plate 230 may include a material of polyimide (PI). A substrate of the flexible OLED display back plate 210 is a flexible substrate, which may include a material of PI or another flexible material.

In some embodiments, a thickness of the OLED display panel ranges from 0.2 mm to 1.5 mm.

In particular, the OLED display panel can realize flexible display, for example, may be formed as a foldable screen according to actual requirements. Moreover, the protective cover plate 230 of the OLED display panel may be made of a material of PI, so that the panel can be thinned and lightened and the requirement of a customer on the thickness of the panel can be met. For example, the required thickness of an ultrathin foldable screen can be achieved to be within a range of 0.4 mm to 0.65 mm, so that the design requirement of the foldable screen is met.

Figure 12:
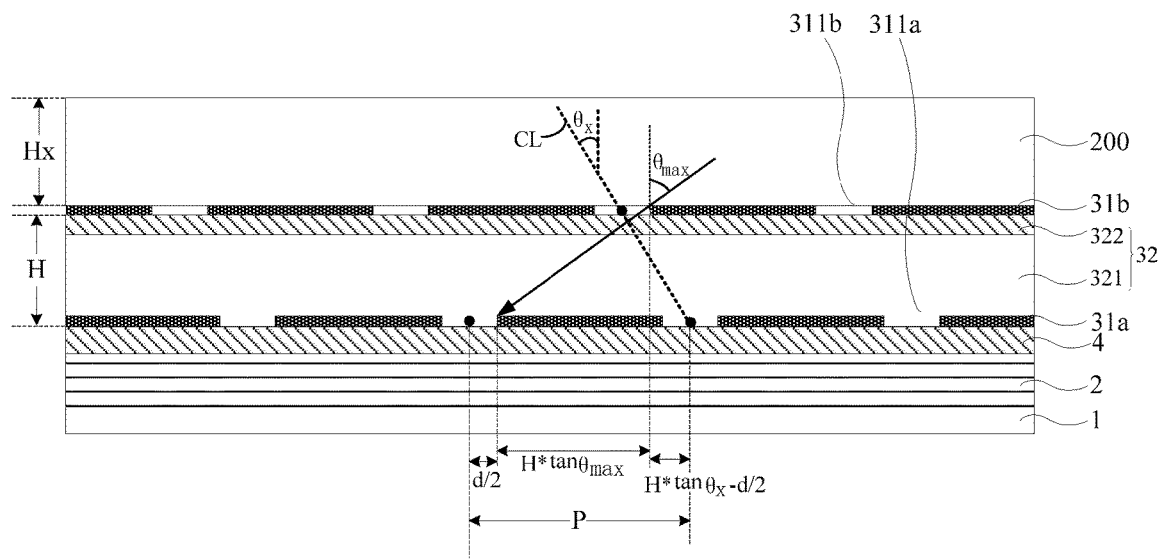
FIG. 12 is a schematic diagram showing another structure of a display device according to an embodiment of the present disclosure.

Referring to FIG. 12, in some embodiments, the light path structure 3 of the texture recognition assembly 100 of the display device provided by the present disclosure may include two light shielding layers 31a and 31b and one light transmitting layer 32. The distance between the two light shielding layers 31a and 31b is used for determining a height of the light path structure 3, and the light transmitting holes 311a and 311b in the light shielding layers 31 are used for determining the collimation light receiving angle. The light path structure 3 shown in FIG. 12 specifically includes the first light shielding layer 31a, the transparent resin layer 321, the transparent inorganic insulating layer 322, and the second light shielding layer 31b, which are sequentially stacked on the optical sensing structure 2.

The first light shielding layer 31a includes first light transmitting holes 311a arranged in an array, and the second light shielding layer 31b includes second light transmitting holes 311b arranged in an array. The period of the first light transmitting holes 311a is the same as that of the second light transmitting holes 311b. The first light transmitting holes 311a are in one-to-one correspondence with the second light transmitting holes 311b, and the orthogonal projections of a first light transmitting hole 311a and the corresponding second light transmitting hole on the substrate 1 do not overlap each other.

Since the orthogonal projections of a first light transmitting hole 311a and a second light transmitting hole 311b corresponding to the first light transmitting hole 311a on the substrate 1 do not overlap each other, the light transmitting channel Q defined by a first light transmitting hole 311a and the corresponding second light transmitting hole 311b is inclined. Under a service environment with strong ambient light, since a portion of ambient light with a small incident angle of 0° and close to 0° cannot pass through light path structure 3, an intensity of the ambient light received by the optical sensing structure 2 is effectively reduced, which is favorable to improving the accuracy of recognizing a texture.

With continued reference to FIG. 12, in general, there is the maximum angle, which is denoted as $\theta_{max}$, for a light ray emitted from the OLED display panel, and $\theta_{max}$ also represents the maximum angle of the light reflected by a finger. In a case where the light path structure 3 includes two light shielding layers, in order to avoid the light crosstalk, the distance H between the two light shielding layers, the inclination angle $\theta x$ of the central axis of a light transmitting channel Q, the maximum angle $\theta_{max}$ of the light reflected by a finger, and the period P of the light transmitting holes in each of the light shielding layers (either the diameters or the periods of light transmitting holes in the two light shielding layers are a constant) satisfy following relationship:

$$P \geq (\tan \theta x + \tan \theta_{max}) * H$$

That is, in this case, the minimum value of P is $(\tan \theta x + \tan \theta_{max}) * H$, which can effectively avoid the occurrence of the light crosstalk.

Figure 13:
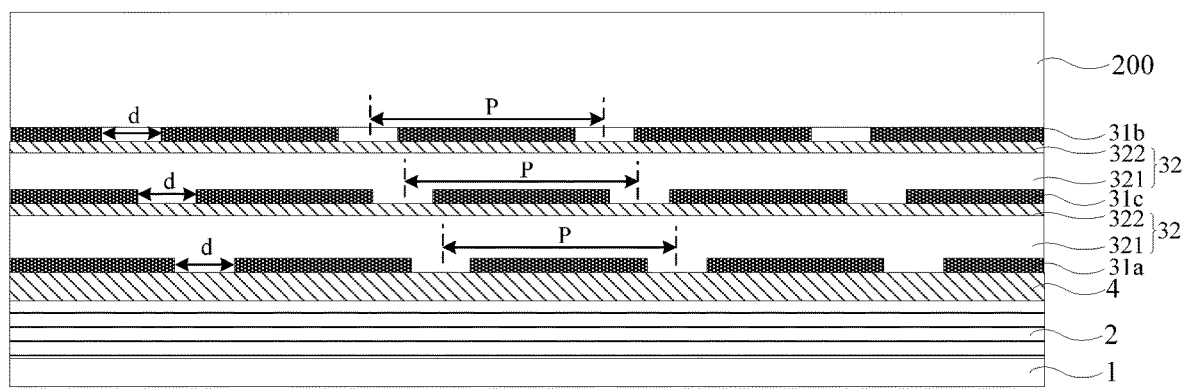
FIG. 13 is a schematic diagram showing still another structure of a display device according to an embodiment of the present disclosure.
Figure 14:
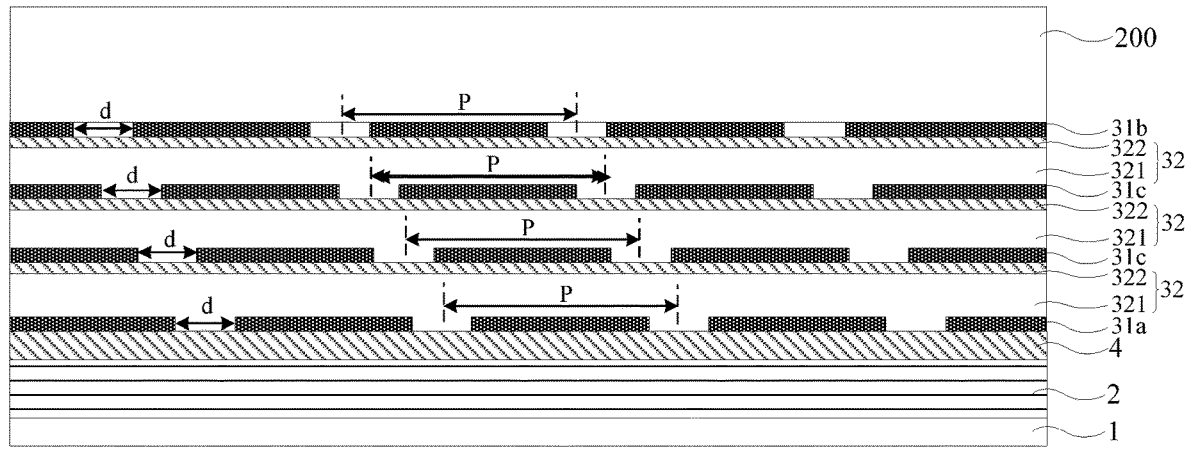
FIG. 14 is a schematic diagram showing still another structure of a display device according to an embodiment of the present disclosure.

Referring to FIGS. 13 and 14, in some embodiments, the light path structure 3 of the texture recognition assembly 100 of the display device according to the embodiments of the present disclosure may alternatively include three or more light shielding layers, and in this case, the number of the light transmitting layers 32 may also be increased accordingly. By arranging at least one third light shielding layer 31c between the first light shielding layer 31a and the second light shielding layer 31b, the at least one third light shielding layer 31c can block light which passes through a second light transmitting hole 311b and irradiates to other light transmitting holes except the corresponding first light transmitting hole 311a, thereby effectively avoiding the problem of light crosstalk, and improving the accuracy of the recognized information of a texture; meanwhile, the period P of the light transmitting holes in each of the first light shielding layer 31a and the second light shielding layer 31b can also be reduced. The minimum value of the period P is related to the number and positions of the third light shielding layers 31c, the diameter of each of the third light transmitting holes 311c, and the like, and theoretically, the minimum value of the period P may be close to the diameter d of each of the light transmitting holes.

The display device may further include signal lines (including gate lines, data lines, detection lines, etc.) for supplying electrical signals (including scanning signals, data signals, detection signals, etc.), and a light emitting state of each light emitting device may be controlled by a driver circuit to realize the lighting of a sub-pixel.

Figure 15A:
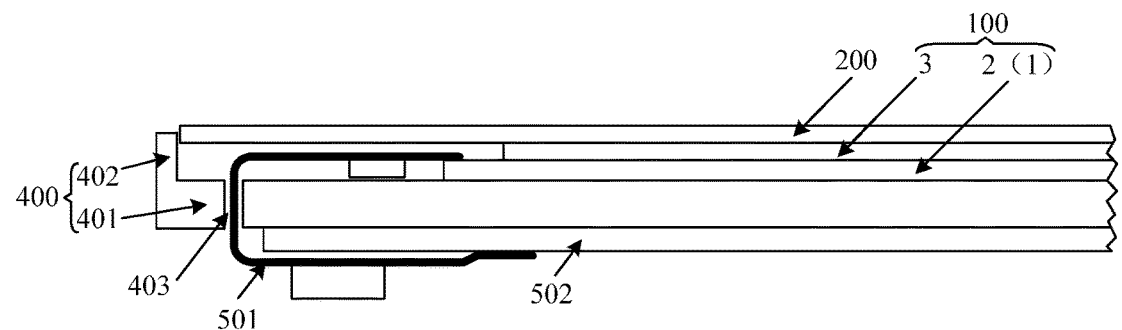
FIG. 15a is a schematic diagram showing another structure of a display device according to an embodiment of the present disclosure.
Figure 15B:
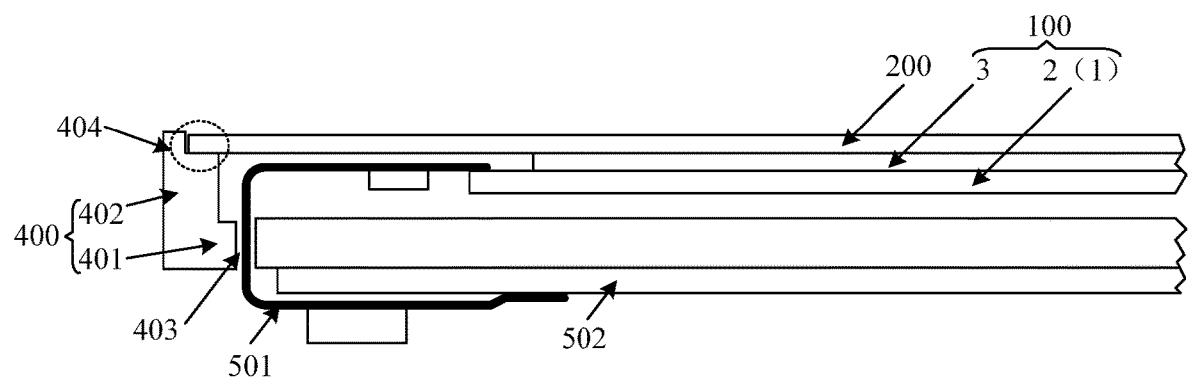
FIG. 15b is a schematic diagram showing still another structure of a display device according to an embodiment of the present disclosure.
Figure 15C:
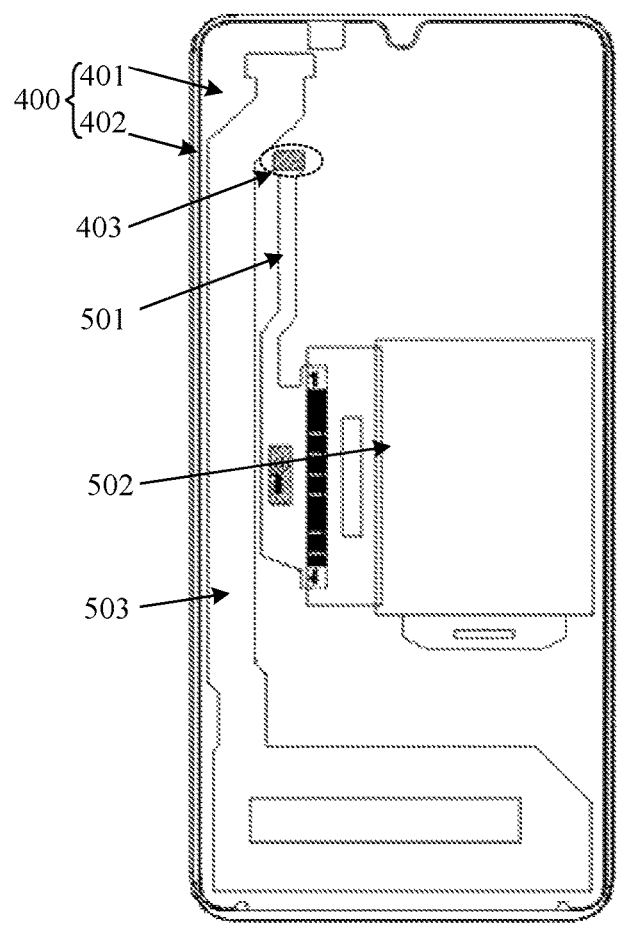
FIG. 15c is a schematic rear view of a bottom plate shown in FIGS. 15a and 15b.

Referring to FIGS. 15a to 15c, in some embodiments, the display device may further include a middle frame 400. The middle frame 400 includes a bottom plate 401 and a sidewall 402 formed by an edge of the bottom plate 401 bending towards a front surface of the bottom plate 401. The bottom plate 401 and the sidewall 402 form a holding groove, and the texture recognition assembly and the display panel 200 are fixed in the holding groove. The display panel 200 is located on a side of the texture recognition assembly distal to the bottom plate 401. The front surface of the bottom plate 401 may refers to a surface of the bottom plate 401 on which the sidewall 402 is formed, and a back surface and the front surface are opposite surfaces of the bottom plate 401.

Referring to FIG. 15a, as an embodiment, the texture recognition assembly is fixed to the bottom plate 401. For example, the substrate 1 of the texture recognition assembly is fixed to the front surface of the bottom plate 401 by an adhesive (e.g., a double-sided adhesive, an optically clear adhesive, etc.), thereby fixing the texture recognition assembly 100 and the display panel 200 to the middle frame 400.

Referring to FIG. 15b, as still another embodiment, a step-shaped support structure is formed on the sidewall 402, and the display panel 200 is fixed on the step-shaped support structure 404. As an example, the display panel 200 is fixed to the step-shaped support structure 404 by an adhesive (e.g., a double-sided adhesive, an optically clear adhesive, etc.), thereby fixing the texture recognition assembly 100 and the display panel 200 to the middle frame 400.

Alternatively, in order to increase the firmness of fixing, the display panel 200 may be fixed to the step-shaped support structure 400 while the texture recognition assembly is fixed to the bottom plate 401.

In some embodiments, the bottom plate 401 has a through hole 403 formed therein, and the display device further includes a texture-recognition flexible circuit board 501 and a texture-recognition chip 502. The texture-recognition flexible circuit board 501 passes through the through hole 403, one end of the texture-recognition flexible circuit board being electrically connected to a bonding electrode located in a bonding region of the texture recognition assembly 100 (generally, through a bonding process), and the other end of the texture-recognition flexible circuit board being electrically connected to the texture-recognition chip 502 located on the back surface of the bottom plate 401 (generally, through a die bonding thin film process). Similarly, a display chip (not shown) and a display flexible circuit board 503 may be electrically connected to the display panel 200 in the holding groove in the same manner.

In some embodiments, the display panel may further have functional layers such as an encapsulation layer and a touch layer, which may be referred to related technologies and are not described herein.

The display device according to the present embodiment may be any product or component having a function of recognizing a texture, such as a mobile phone, a tablet computer, a display, a notebook computer, or the like, which is not limited in an embodiment of the present disclosure.

Figure 16:
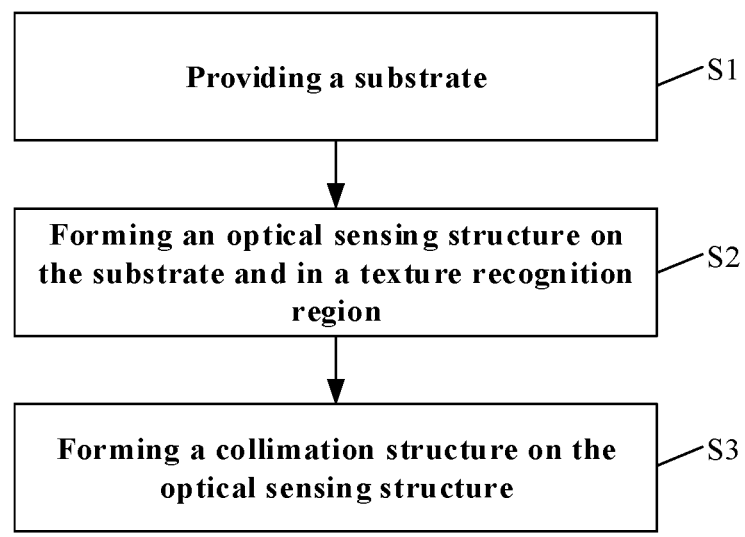
FIG. 16 is a schematic flowchart showing a method for manufacturing a texture recognition assembly according to an embodiment of the present disclosure.

Based on the same inventive concept, an embodiment of the present disclosure provides a method for manufacturing a texture recognition assembly, and the method may be used for manufacturing the texture recognition assembly according to any one of the foregoing embodiments. Referring to FIG. 16, the texture recognition assembly includes the texture recognition region and the peripheral region located at a periphery of the texture recognition region, and the peripheral region includes a binding region. For example, the method may include the following steps S1 to S3.

In step S1, a substrate is provided.

In step S2, an optical sensing structure is formed on the substrate and in the texture recognition region.

In step S3, a light path structure is formed on the optical sensing structure, wherein the light path structure is at least in the texture recognition region and does not cover the binding region, the light path structure is provided therein with a plurality of light transmitting channels, light incident on the light path structure can only pass through the light transmitting channels, the light path structure includes: at least two light shielding layers and a light transmitting layer located between any adjacent two of the at least two light shielding layers, the at least two light shielding layers and the light transmitting layer are stacked together, the light shielding layer closest to the optical sensing structure includes therein first light transmitting holes arranged in an array, the light shielding layer farthest away from the optical sensing structure includes therein second light transmitting holes in one-to-one correspondence with the first light transmitting holes, a first light transmitting hole and a corresponding second light transmitting hole define a light transmitting channel, and orthogonal projections of a first light transmitting hole and the corresponding second light transmitting hole on the substrate do not overlap each other.

In the manufacturing method provided by the present embodiment, it only needs to form the optical sensing structure on the substrate, and then directly form at least two light shielding layers and the light transmitting layer that have relatively simple structure on the optical sensing structure, to realize an excellent collimation effect. Further, a resultant device has a lighter and thinner structure, and the difficulty of a manufacturing process of the device can be reduced. The problem of low product yield such as foaming and the like caused by attaching a light path structure to the texture recognition assembly by using an optically clear adhesive (OCA) can be avoided. Further, since layers are directly formed on the optical sensing structure to form the light path structure, the light path structure can be formed by using a device that is commonly used for forming a layer on an array substrate, and thus addition of a new manufacturing device is not necessary.

In some embodiments, each light shielding layer of the light path structure may be made of a material with a high light shielding capability, such as black resin, for example, BM. The process parameters for the light shielding layers are generally the same. Specifically, each light shielding layer is generally formed by coating a continuous layer on the substrate, and then forming the light transmitting holes by a photolithography process or a nano-imprinting process.

In some embodiments, the formation of the light transmitting layer during the formation of the light path structure includes: forming a transparent resin layer on the light shielding layer by using an ink-jet printing process, and forming a transparent inorganic insulating layer covering the transparent resin layer and on the transparent resin layer by using a low-temperature chemical vapor deposition process.

Specifically, the transparent resin layer and the transparent inorganic insulating layer in each light transmitting layer may be formed by using an apparatus for forming a thin film encapsulation structure in an array substrate. That is, the transparent inorganic insulating layer may be formed by using a Chemical Vapor Deposition (CVD) apparatus for forming an inorganic thin film encapsulation layer, and the transparent resin layer may be formed by using an inkjet printing (IJP) apparatus for forming an organic thin film encapsulation layer. After a light shielding layer is formed, the transparent resin layer may be formed first to ensure that the thickness required by the entire light transmitting layer 32 is generally in the order of micron, and then the transparent inorganic insulating layer with a smaller thickness in the order of nanometer is formed on the transparent resin layer, where process parameters and the thickness of transparent inorganic insulating layers are generally the same. The transparent resin layer may be made of a resin material such as acrylic, and if a black resin material is directly coated on the resin material, a layer with a uniform thickness cannot be formed, which may cause problems such as local material aggregation, and the like. Therefore, the transparent inorganic insulating layer is formed on the transparent resin layer, which can ensure the uniformity of a light shielding layer formed thereon.

In particular, in the manufacturing method according to any one of the foregoing embodiments of the present disclosure, the light path structure is formed by using a low temperature process. Specifically, a temperature adopted in the low temperature process is about 80° C. Since each light shielding layer and each transparent resin layer are formed at a low temperature, the formation of the transparent inorganic insulating layer by a low temperature chemical vapor deposition process can prevent patterns of the underlying light shielding layer and the transparent resin layer from being damaged by a high temperature environment.

In some embodiments, the method may further include, prior to step S2, forming a ground shielding layer on the optical sensing structure, and forming a planarization layer on the ground shielding layer by using a plasma enhanced chemical vapor deposition process, so that the planarization layer is arranged to have a continuous surface on the substrate and have a hollow pattern only in the binding region.

The ground shielding layer is generally disposed to have a continuous surface in the texture recognition region, so as to prevent the optical sensing structure from being electromagnetically interfered by an external environment, and the ground shielding layer is generally made of ITO to ensure a certain light transmittance. The planarization layer completely covers the ground shielding layer, to protect the ground shielding layer, and prevent the ground shielding layer from being exposed in a hydrogen-rich environment in which indium ions in ITO will be replaced by hydrogen when layers of the light path structure are subsequently formed in a chemical vapor deposition apparatus, thereby preventing the light transmittance of the ground shielding layer from being reduced due to the atomization problem of the ground shielding layer.

It should be understood that the above embodiments are merely exemplary embodiments employed to illustrate the principles of the present disclosure, and the present disclosure is not limited thereto. It will be apparent to one of ordinary skill in the art that various changes and modifications may be made therein without departing from the spirit and scope of the present disclosure, and such changes and modifications are to be considered to fall within the scope of the present disclosure.

What is claimed is:

1. A texture recognition assembly, comprising a texture recognition region and a peripheral region at a periphery of the texture recognition region, the peripheral region having therein a binding region, and the texture recognition assembly further comprising:

a substrate;

an optical sensing structure on the substrate and in the texture recognition region; and a light path structure, which is on a side of the optical sensing structure distal to the substrate, at least in the texture recognition region and does not cover the binding region, and comprises a plurality of light transmitting channels such that light incident on the light path structure passes through the light path structure only via the light transmitting channels;

wherein the light path structure comprises at least two light shielding layers and a light transmitting layer between any adjacent two of the at least two light shielding layers, the at least two light shielding layers and the light transmitting layer are stacked together, the light shielding layer closest to the optical sensing structure comprises therein first light transmitting holes arranged in an array, the light shielding layer farthest away from the optical sensing structure comprises therein second light transmitting holes in one-to-one correspondence with the first light transmitting holes, a first light transmitting hole and a corresponding second light transmitting hole define a light transmitting channel, and orthogonal projections of the first light transmitting hole and the corresponding second light transmitting hole on the substrate do not overlap each other; and wherein a connection line between a center of the first light transmitting hole and a center of the corresponding second light transmitting hole forms a central axis of the light transmitting channel, the central axis and a normal of a plane where the substrate is located form an inclination angle $\theta x$, and $\theta x$ is in a range of $[40°, 72°]$.

2. The texture recognition assembly according to claim 1, wherein a collimation light receiving angle $\theta$ of the light path structure satisfies a relationship of $\theta = \arctan (X+d)/H - \arctan (X-d)/H$, where X is a distance between an orthogonal projection of a center of the first light transmitting hole on the substrate and an orthogonal projection of a center of the corresponding second light transmitting hole on the substrate, d is a diameter of each of the first light transmitting hole and the corresponding second light transmitting hole, and H is a distance between the first light transmitting hole and the corresponding second light transmitting hole in a direction perpendicular to the substrate.

3. The texture recognition assembly according to claim 2, wherein θ is in range of (0°, 60°].

4. The texture recognition assembly according to claim 1, wherein the light path structure comprises two light shielding layers.

5. The texture recognition assembly according to claim 1, wherein the light path structure comprises three or more light shielding layers, and the at least two light shielding layers comprise a first light shielding layer closest to the optical sensing structure, a second light shielding layer farthest away from the optical sensing structure, and at least one third light shielding layer between the first light shielding layer and the second light shielding layer; and each third light shielding layer comprises therein third light transmitting holes in one-to-one correspondence with the first light transmitting holes, and a center of a third light transmitting hole is in the light transmitting channel defined by the first light transmitting hole and the second light transmitting hole which correspond to the third light transmitting hole.

6. The texture recognition assembly according to claim 5, wherein a period of the first light transmitting holes in the first light shielding layer, a period of the second light transmitting holes in the second light shielding layer, and a period of the third light transmitting holes in each third light shielding layer are equal to each other;

a center of a first light transmitting hole, a center of the second light transmitting hole corresponding to the first light transmitting hole, and a center of the third light transmitting hole corresponding to the first light transmitting hole are on a same straight line, and
wherein the diameter of each first light transmitting hole, the diameter of each second light transmitting hole, and a diameter of each third light transmitting hole are equal to each other; or
wherein the at least one third light shielding layer of the light path structure is two or three third light shielding layers.

7. The texture recognition assembly according to claim 6, wherein the at least one third light shielding layer of the light path structure is one third light shielding layer; and
wherein the light transmitting layer between the third light shielding layer and the first light shielding layer is a first light transmitting layer, the light transmitting layer between the third light shielding layer and the second light shielding layer is a second light transmitting layer, and a thickness of the first light transmitting layer is greater than a thickness of the second light transmitting layer; or
wherein the light transmitting layer between the third light shielding layer and the first light shielding layer is a first light transmitting layer, and the light transmitting layer between the third light shielding layer and the second light shielding layer is a second light transmitting layer; and the diameter of each first light transmitting hole is in a range of 2 um to 10 um, the period of first light transmitting holes is in a range of 10 um to 100 um, a thickness of the first light transmitting layer is in a range of 10 um to 20 um, and a thickness of the second light transmitting layer is in a range of 5 um to 15 um.

8. The texture recognition assembly according to claim 1, wherein the texture recognition region comprises a photosensitive region, a spacer region, and a light shielding region, the spacer region is between the photosensitive region and the light shielding region; the optical sensing structure is in the photosensitive region and the light shielding region, and has no pattern in the spacer region;
an orthogonal projection of at least one of the at least two light shielding layers on the substrate completely covers the light shielding region; and
wherein the light shielding region is on one side or two opposite sides or two intersecting sides of the photosensitive region.

9. The texture recognition assembly according to claim 1, wherein the light transmitting layer comprises a transparent resin layer and a transparent inorganic insulating layer;
between any adjacent two light shielding layers, the transparent resin layer is adjacent to the light shielding layer proximal to the substrate, and the transparent inorganic insulating layer is adjacent to the light shielding layer distal to the substrate;
wherein the light shielding layers extend from the texture recognition region to a joint edge of the peripheral region; an orthogonal projection of the transparent resin layer on the substrate completely covers an orthogonal projection of an adjacent light shielding layer on the substrate; and an orthogonal projection of the transparent inorganic insulating layer on the substrate completely covers and is larger than an orthogonal projection of an adjacent transparent resin layer on the substrate; and
wherein the light path structure further comprises a blocking wall structure, which surrounds the transparent resin layer, in a layer where the light shielding layer adjacent to the transparent resin layer is located, and is separate from the light shielding layer adjacent to the transparent resin layer.

10. The texture recognition assembly according to claim 1, wherein the optical sensing structure comprises a plurality of optical sensors arranged in an array, one of the plurality of optical sensors corresponds to a plurality of first light transmitting holes, and one of the first light transmitting holes corresponds to one of the plurality of optical sensors;
wherein an orthogonal projection of each optical sensor on the substrate is a square of which each side has a length D, the period of the first light transmitting holes is P, and D and P satisfy the relationship of D=N*P, N being a positive even number; and
wherein D is in a range of 10 um to 200 um.

11. The texture recognition assembly according to claim 1, wherein the optical sensing structure comprises a gate electrode, a gate insulating layer, an active layer, a source-drain electrode, a first insulating layer, a first electrode, a semiconductor layer, a second electrode, a protective layer, a second insulating layer, a passivation layer, a bias voltage line, and a blocking layer, which are sequentially stacked along a direction away from the substrate.

12. The texture recognition assembly according to claim 11, wherein an orthogonal projection of the source-drain electrode on the substrate completely covers and is larger than an orthogonal projection of the first electrode on the substrate; or
wherein the source-drain electrode is in direct contact with the semiconductor layer, and the source-drain electrode and the first electrode are in a same layer.

13. The texture recognition assembly according to claim 11, further comprising a planarization layer, which is between the light path structure and the optical sensing structure, has a continuous surface, and has a hollow pattern only in the binding region; and a ground shielding layer between the planarization layer and the optical sensing structure, wherein the ground shielding layer is adjacent to the planarization layer, a pattern of the ground shielding layer is covered by a pattern of the planarization layer, and an orthogonal projection of the ground shielding layer on the substrate covers an orthogonal projection of the optical sensing structure on the substrate.

14. The texture recognition assembly according to claim 11, further comprising a binding electrode in the binding region, and the binding electrode and the bias voltage line are in a same layer;

wherein the binding region comprises a binding region of a gate driver chip, and a binding electrode in the binding region of the gate driver chip comprises a first binding electrode; a first connection electrode in a layer where the gate electrode is located, a second connection electrode in a layer where the source-drain electrode is located, and a third connection electrode in a layer where the first electrode is located are arranged between the first binding electrode and the substrate; and the first connection electrode is electrically connected to the second connection electrode through a first through hole penetrating through the gate insulating layer, the second connection electrode is electrically connected to the third connection electrode through a second through hole penetrating through the first insulating layer, the third connection electrode is electrically connected to the first binding electrode through a third through hole penetrating through the passivation layer, and the first connection electrode is electrically connected to the gate electrode through a gate line and a gate line fan-out trace; and wherein each of a number of first through holes corresponding to one first binding electrode, a number of second through holes corresponding to the one first binding electrode, and a number of third through holes corresponding to the one first binding electrode is at least two, and orthogonal projections of the first through holes, the second through holes and the third through holes on the substrate do not overlap each other and are alternately arranged along an extension direction of the first binding electrode.

15. The texture recognition assembly according to claim 11, further comprising a binding electrode in the binding region, and the binding electrode and the bias voltage line are in a same layer, wherein the binding region further comprises a binding region of a data driver chip, and binding electrodes in the binding region of the data driver chip comprise a second binding electrode and a third binding electrode;

a fourth connection electrode in a layer where the source-drain electrode is located and a fifth connection electrode in a layer where the first electrode is located are arranged between the second binding electrode and the substrate, the fourth connection electrode is electrically connected to the fifth connection electrode through a fourth through hole penetrating through the first insulating layer, the fifth connection electrode is electrically connected to the second binding electrode through a fifth through hole penetrating through the passivation layer, and the fourth connection electrode is electrically connected to the source-drain electrode through a data line and a data line fan-out trace; and the third binding electrode is electrically connected to the bias voltage line through a bias voltage fan-out trace.

16. The texture recognition assembly according to claim 11, further comprising a light filter layer which is on a side of the semiconductor layer distal to the substrate, and is configured to cause a central wavelength of the light passing through the light filter layer to be less than 600 nm; and wherein the light filter layer is configured to transmit light having a wavelength ranging from 480 nm to 580 nm; or wherein a material of the second insulating layer comprises a resin material having a light filtering function, and the light filter layer and the second insulating layer are multiplexed and combined into a same layer; and/or a material of the blocking layer comprises a resin material having a light filtering function, and the light filter layer and the blocking layer are multiplexed and combined into a same layer; and/or each light transmitting layer comprises a transparent resin layer and a transparent inorganic insulating layer, between any adjacent two light shielding layers, the transparent resin layer is adjacent to the light shielding layer proximal to the substrate, the transparent inorganic insulating layer is adjacent to the light shielding layer distal to the substrate, a material of the transparent resin layer comprises a resin material having a light filtering function, and the light filter layer and the transparent resin layer are multiplexed and combined into a same layer.

17. A display device, comprising the texture recognition assembly according to claim 1, and a display panel on the texture recognition assembly, wherein the display panel and the texture recognition assembly are fixed together by an optically clear adhesive; and wherein the display panel is an OLED display panel, the OLED display panel comprises an OLED display back plate, a polarizer, and a protective cover plate, which are sequentially stacked in a direction away from the texture recognition assembly, and the protective cover plate comprises a material of polyimide; and wherein the OLED display panel has a thickness ranging from 0.2 mm to 1.5 mm; and wherein the OLED display panel has a thickness ranging from 0.4 mm to 0.65 mm; or the display device further comprises a middle frame, the middle frame comprises a bottom plate and a sidewall formed by an edge of the bottom plate bending towards a front surface of the bottom plate, the bottom plate and the sidewall form a holding groove, the texture recognition assembly and the display panel are fixed in the holding groove, and the display panel is on a side of the texture recognition assembly distal to the bottom plate; and wherein the texture recognition assembly is fixed to the bottom plate and/or the sidewall comprises a step-shaped support structure to which the display panel is fixed; and wherein a through hole is formed in the bottom plate, and the display device further comprises a texture-recognition flexible circuit board and a texture-recognition chip; and the texture-recognition flexible circuit board penetrates through the through hole, one end of the texture-recognition flexible circuit board is electrically connected to the binding electrode in the binding region of the texture recognition assembly, and the other end of the texture-recognition flexible circuit board is electrically connected to the texture-recognition chip on a back surface of the bottom plate.

18. A method for manufacturing a texture recognition assembly, which is the texture recognition assembly according to claim 1, wherein the texture recognition assembly comprises the texture recognition region and the peripheral region at the periphery of the texture recognition region, the peripheral region having therein the binding region, and the method comprises:
  providing the substrate;
  forming the optical sensing structure on the substrate and in the texture recognition region; and
  forming the light path structure on the optical sensing structure, wherein the light path structure is at least in the texture recognition region and does not cover the binding region, and is provided with the plurality of light transmitting channels such that light incident on the light path structure passes through the light path structure only via the light transmitting channels; the light path structure comprises the at least two light shielding layers and the light transmitting layer located between any adjacent two of the at least two light shielding layers, the at least two light shielding layers and the light transmitting layer are stacked together, the light shielding layer closest to the optical sensing structure is provided therein with the first light transmitting holes arranged in an array, the light shielding layer farthest away from the optical sensing structure is provided therein with the second light transmitting holes in one-to-one correspondence with the first light transmitting holes, a first light transmitting hole and a corresponding second light transmitting hole define a light transmitting channel, and the orthogonal projections of the first light transmitting hole and the corresponding second light transmitting hole on the substrate do not overlap each other;
    wherein forming a light shielding layer during forming the light path structure comprises: forming a light shielding material film; and processing the light shielding material film through a photolithography process or a nano-imprinting process to form light transmitting holes in the light shielding material film; or
    wherein forming the light transmitting layer during forming the light path structure comprises: forming a transparent resin layer on a light shielding layer by using an ink-jet printing process; and forming a transparent inorganic insulating layer on the transparent resin layer by using a low temperature chemical vapor deposition process, wherein the transparent inorganic insulating layer covers the transparent resin layer.

19. A texture recognition assembly, comprising a texture recognition region and a peripheral region at a periphery of the texture recognition region, the peripheral region having therein a binding region, and the texture recognition assembly further comprising:
  a substrate;
  an optical sensing structure on the substrate and in the texture recognition region; and
  a light path structure, which is on a side of the optical sensing structure distal to the substrate, at least in the texture recognition region and does not cover the binding region, and comprises a plurality of light transmitting channels such that light incident on the light path structure passes through the light path structure only via the light transmitting channels;
    wherein the light path structure comprises at least two light shielding layers and a light transmitting layer between any adjacent two of the at least two light shielding layers, the at least two light shielding layers and the light transmitting layer are stacked together, the light shielding layer closest to the optical sensing structure comprises therein first light transmitting holes arranged in an array, the light shielding layer farthest away from the optical sensing structure comprises therein second light transmitting holes in one-to-one correspondence with the first light transmitting holes, a first light transmitting hole and a corresponding second light transmitting hole define a light transmitting channel, and orthogonal projections of the first light transmitting hole and the corresponding second light transmitting hole on the substrate do not overlap each other; and
  wherein each first light transmitting hole has a diameter equal to a diameter of each second light transmitting hole.

20. A method for manufacturing a texture recognition assembly, which is the texture recognition assembly according to claim 19, wherein the texture recognition assembly comprises the texture recognition region and the peripheral region at the periphery of the texture recognition region, the peripheral region having therein the binding region, and the method comprises:
  providing the substrate;
  forming the optical sensing structure on the substrate and in the texture recognition region; and
  forming the light path structure on the optical sensing structure, wherein the light path structure is at least in the texture recognition region and does not cover the binding region, and is provided with the plurality of light transmitting channels such that light incident on the light path structure passes through the light path structure only via the light transmitting channels; the light path structure comprises the at least two light shielding layers and the light transmitting layer located between any adjacent two of the at least two light shielding layers, the at least two light shielding layers and the light transmitting layer are stacked together, the light shielding layer closest to the optical sensing structure is provided therein with the first light transmitting holes arranged in an array, the light shielding layer farthest away from the optical sensing structure is provided therein with the second light transmitting holes in one-to-one correspondence with the first light transmitting holes, a first light transmitting hole and a corresponding second light transmitting hole define a light transmitting channel, and the orthogonal projections of the first light transmitting hole and the corresponding second light transmitting hole on the substrate do not overlap each other;
    wherein forming a light shielding layer during forming the light path structure comprises: forming a light shielding material film; and processing the light shielding material film through a photolithography process or a nano-imprinting process to form light transmitting holes in the light shielding material film; or
    wherein forming the light transmitting layer during forming the light path structure comprises: forming a transparent resin layer on a light shielding layer by using an ink-jet printing process; and forming a transparent inorganic insulating layer on the transparent resin layer by using a low temperature chemical vapor deposition process, wherein the transparent inorganic insulating layer covers the transparent resin layer.

* * * * *